(12) United States Patent
Egawa

(10) Patent No.: US 9,219,096 B2
(45) Date of Patent: Dec. 22, 2015

(54) SOLID-STATE IMAGING DEVICE

(71) Applicant: Kabushiki Kaisha Toshiba, Minato-ku (JP)

(72) Inventor: Yoshitaka Egawa, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 162 days.

(21) Appl. No.: 13/938,616

(22) Filed: Jul. 10, 2013

(65) Prior Publication Data

US 2014/0239430 A1    Aug. 28, 2014

(30) Foreign Application Priority Data

Feb. 26, 2013    (JP) .................. 2013-036349

(51) Int. Cl.
*H01L 31/0232*    (2014.01)
*H01L 27/148*    (2006.01)
*H01L 27/146*    (2006.01)

(52) U.S. Cl.
CPC ...... *H01L 27/14806* (2013.01); *H01L 27/1464* (2013.01); *H01L 27/14603* (2013.01); *H01L 27/14612* (2013.01); *H01L 27/14641* (2013.01)

(58) Field of Classification Search
CPC .............. H01L 27/1464; H01L 27/14603; H01L 27/14612; H01L 27/14641
USPC ........................................................ 257/432
See application file for complete search history.

(56) References Cited

U.S. PATENT DOCUMENTS

| 2011/0227091 A1* | 9/2011 | Toda ........................ 257/76 |
| 2011/0242378 A1 | 10/2011 | Mabuchi |
| 2011/0248371 A1 | 10/2011 | Matsumura et al. |

FOREIGN PATENT DOCUMENTS

| JP | 2004-165467 | 6/2004 |
| JP | 3906202 | 1/2007 |
| JP | 2008-103368 A | 5/2008 |
| JP | 2009-302349 A | 12/2009 |
| JP | 2011-124946 A | 6/2011 |
| JP | 2011-166171 | 8/2011 |
| JP | 2011-217315 | 10/2011 |
| JP | 2011-222708 | 11/2011 |
| JP | 2011-249406 | 12/2011 |

(Continued)

OTHER PUBLICATIONS

Office Action issued on Jun. 16, 2014 in the corresponding Korean Patent Application No. 10-2013-0086471 (with English Translation).

(Continued)

*Primary Examiner* — Douglas Menz
(74) *Attorney, Agent, or Firm* — Oblon, McClelland, Maier & Neustadt, L.L.P.

(57) ABSTRACT

According to one embodiment, a photoelectric converting layer, a charge accumulating layer, and a light collecting unit are provided. The photoelectric converting layer is formed at a back surface side of a semiconductor substrate. The charge accumulating layer is formed at a front surface side of the semiconductor substrate, and accumulates charges photoelectric-converted by the photoelectric converting layer. The light collecting unit makes light incident to the back surface side of the semiconductor substrate to be collected on the photoelectric converting layer not to be incident to the charge accumulating layer.

7 Claims, 21 Drawing Sheets

(56) References Cited

FOREIGN PATENT DOCUMENTS

| | | |
|---|---|---|
| JP | 2012-4443 A | 1/2012 |
| JP | 2012-84645 | 4/2012 |

OTHER PUBLICATIONS

Office Action issued Jun. 30, 2015 in Japanese Patent Application No. 2013-036349 (with English language translation).

* cited by examiner

SOLID-STATE IMAGING DEVICE

CROSS-REFERENCE TO RELATED APPLICATIONS

This application is based upon and claims the benefit of priority from Japanese Patent Application No. 2013-36349, filed on Feb. 26, 2013; the entire contents of which are incorporated herein by reference.

FIELD

Embodiments described herein relate generally to a solid-state imaging device.

BACKGROUND

There is a solid-state imaging device having a global shutter structure in order to avoid rolling shutter distortion in which a subject is obliquely imaged. In the global shutter structure, a charge accumulating portion is formed separately from a photoelectric converting layer, and all pixels can start an accumulation operation at the same time or execute a reading operation at the same time.

DETAILED DESCRIPTION

In general, according to one embodiment, a photoelectric converting layer, a charge accumulating layer, and a light collecting unit are provided. The photoelectric converting layer is formed at a back surface side of a semiconductor substrate. The charge accumulating layer is formed at a front surface side of the semiconductor substrate, and accumulates charges photoelectric-converted by the photoelectric converting layer. The light collecting unit makes light incident to the back surface side of the semiconductor substrate to be collected on the photoelectric converting layer not to be incident to the charge accumulating layer.

A solid-state imaging device according to exemplary embodiments will be described in detail with reference to the accompanying drawings. The present invention is not limited to the following embodiments.

First Embodiment

Figure 1:
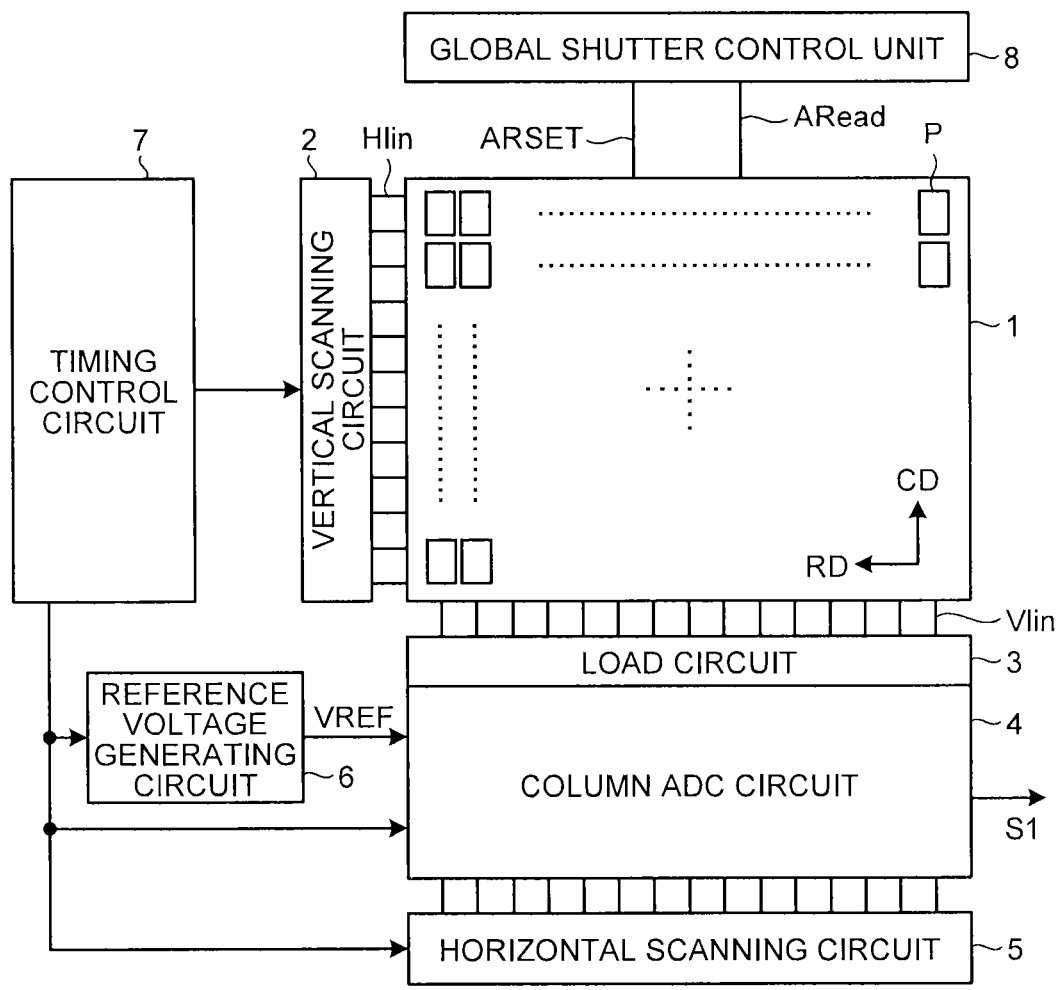
FIG. 1 is a block diagram illustrating a schematic configuration of a solid-state imaging device according to a first embodiment.

FIG. 1 is a block diagram illustrating a schematic configuration of a solid-state imaging device according to a first embodiment.

Referring to FIG. 1, the solid-state imaging device includes a pixel array unit 1. The pixel array unit 1 includes pixels P, which accumulate photoelectric-converted charges, arranged in the form of a matrix in a row direction RD and a column direction CD. In the pixel P, a photoelectric converting layer performing photoelectric conversion and a charge accumulating layer accumulating photoelectric-converted charges may be separately formed. The charge accumulating layer may have a diode structure or a CCD structure. The photoelectric converting layer may be disposed on a back surface side of a semiconductor substrate, and the charge accumulating layer may be disposed on a front surface side of the semiconductor substrate. At this time, the photoelectric converting layer may at least partially overlap the charge accumulating layer. In the pixel array unit 1, a horizontal control line Hlin used for reading control of the pixel P is disposed in the row direction RD, and a vertical signal line Vlin transmitting a signal read from the pixel P is disposed in the column direction CD.

The solid-state imaging device further includes a vertical scanning circuit 2 that scans the pixel P serving as a reading target in the vertical direction, a load circuit 3 that performs a source follower operation with the pixel P and reads a signal from the pixel P out to the vertical signal line Vlin in units of columns, a column analog digital conversion (ADC) circuit 4 that detects a signal component of each pixel P in units of columns by correlated double sampling (CDS), a horizontal scanning circuit 5 that scans the pixel P serving as a reading target in the horizontal direction, a reference voltage generating circuit 6 that outputs a reference voltage VREF to the column ADC circuit 4, a timing control circuit 7 that controls a reading timing or an accumulation timing of each pixel P, and a global shutter control unit 8 that makes all the pixels P to start the accumulation operation at the same time or to execute the reading operation at the same time. A ramp wave may be used as the reference voltage VREF.

As the global reset signal ARSET is rising edge-triggered by the global shutter control unit 8, charges of the photoelectric converting layer of each pixel P are discharged, and as the global reset signal ARSET is falling edge-triggered, the photoelectric conversion and the charge accumulation operation in the photoelectric converting layer of each pixel P starts. As a global read signal ARead is rising edge-triggered by the global shutter control unit 8, charges are read out to the charge accumulating layer from the photoelectric converting layer of each pixel P.

As the read operation is scanned in the vertical direction by the vertical scanning circuit 2, the pixel P is selected in the row direction RD. As the load circuit 3 performs the source follower operation with the corresponding pixel P, the signal read out from the pixel P is transferred to the column ADC circuit 4 via the vertical signal line Vlin. In the reference voltage generating circuit 6, the ramp wave is set as the reference voltage VREF and transferred to the column ADC circuit 4. In the column ADC circuit 4, a clock counting operation is performed until each of the signal level read out from the pixel P and the reset level matches a level of the ramp wave, the signal component of each pixel P is detected by the CDS based on the difference between the signal level and the reset level at that time, and an output signal S1 is output as a digital signal.

Figure 2:
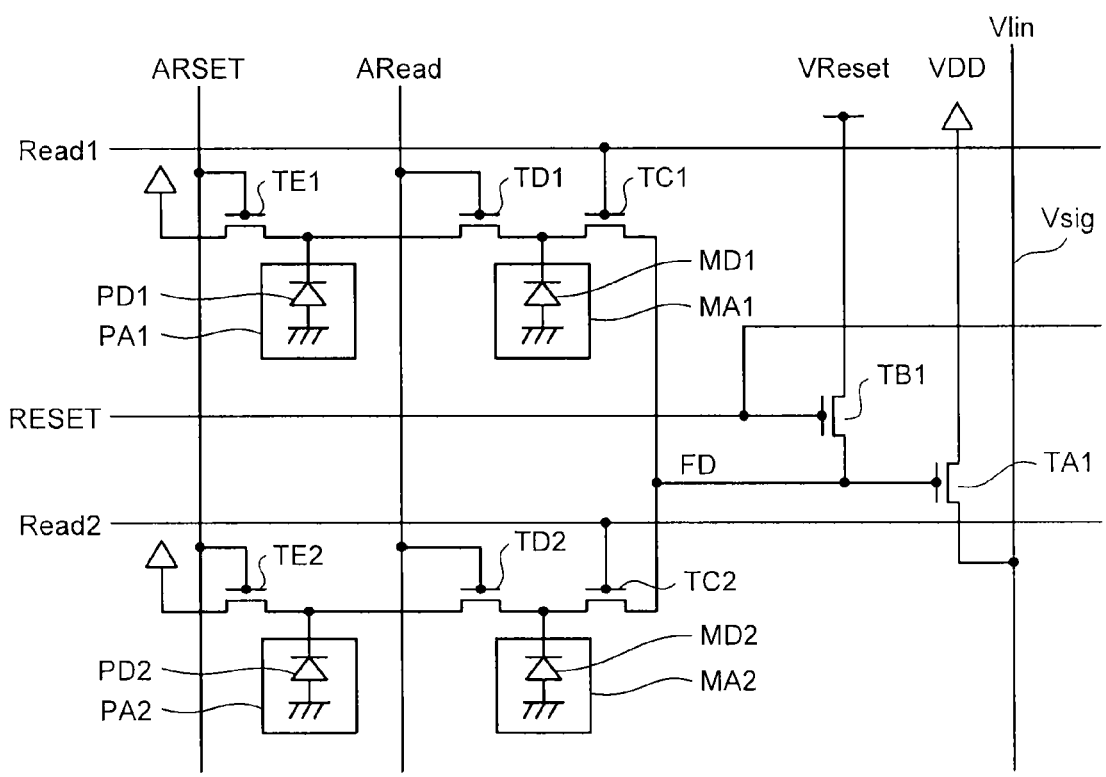
FIG. 2 is a circuit diagram illustrating a schematic configuration of a two-pixel one-cell structure applied to the solid-state imaging device of FIG. 1.

FIG. 2 is a circuit diagram illustrating a schematic configuration of a two-pixel one-cell structure applied to the solid-state imaging device of FIG. 1.

Referring to FIG. 2, a cell includes photoelectric converting layers PA1 and PA2, charge accumulating layers MA1 and MA2, a detecting transistor TA1, a reset transistor TB1, read transistors TC1 and TC2, global reset transistors TE1 and TE2, and global read transistors TD1 and TD2. A floating diffusion FD is formed at a connection point among the detecting transistor TA1, the reset transistor TB1, and the read transistors TC1 and TC2 as a detection node. Here, photodiodes PD1 and PD2 are formed in the photoelectric converting layers PA1 and PA2, respectively, and diodes MD1 and MD2 are formed in the charge accumulating layers MA1 and MA2, respectively.

Here, the photoelectric converting layer PA1, the charge accumulating layer MA1, the read transistor TC1, the global reset transistor TE1, and the global read transistor TD1 may belong to one pixel P of the cell, and the photoelectric converting layer PA2, the charge accumulating layer MA2, the read transistor TC2, the global reset transistor TE2, and the global read transistor TD2 may belong to the other pixel P of the cell. The floating diffusion FD, the detecting transistor TA1 and the reset transistor TB1 are shared by the two pixels P of the cell.

The global reset transistor TE1, the global read transistor TD1 and the read transistor TC1 are connected in series. The photodiode PD1 is connected to a connection point between the global reset transistor TE1 and the global read transistor TD1, and the diode MD1 is connected to a connection point between the global read transistor TD1 and the read transistor TC1.

The global reset transistor TE2, the global read transistor TD2 and the read transistor TC2 are connected in series. The photodiode PD2 is connected to a connection point between the global reset transistor TE2 and the global read transistor TD2, and the diode MD2 is connected to a connection point between the global read transistor TD2 and the read transistor TC2.

Sources of the read transistors TC1 and TC2, a gate of the detecting transistor TA1, and a source of the reset transistor TB1 are connected to the floating diffusion FD.

The global reset signal ARSET is input to gates of the global reset transistors TE1 and TE2, and the global read signal ARead is input to gates of the global read transistors TD1 and TD2. Read signals Read1 and Read2 are input to gates of the read transistors TC1 and TC2, respectively, and a reset signal RESET is input to a gate of the reset transistor TB1. A reset potential VReset is input to a drain of the reset transistor TB1, a power potential VDD is input to a drain of the detecting transistor TA1, and a pixel signal Vsig is output from the source of the detecting transistor TA1 to the vertical signal line Vlin.

The reset potential VReset may be shared with the power potential VDD. By causing the reset potential VReset to be equal to the power potential VDD (for example, 2.8 V), the floating diffusion FD can be reset, and the detecting transistor TA1 can be set to an operation state. Further, by setting the reset potential VReset to 0.2 V to 0.5 V, the floating diffusion FD can become a low voltage state, and the detecting transistor TA1 can be turned off.

As the global reset signal ARSET is rising edge-triggered, the global reset transistors TE1 and TE2 are turned on, changes are discharged from the photodiodes PD1 and PD2 of all the pixels P to the power potential VDD. As the global reset signal ARSET is falling edge-triggered, the global reset transistors TE1 and TE2 are turned off, and the charge accumulation operations of the photodiodes PD1 and PD2 of all the pixels P are started. As the global read signal ARead is applied, the global read transistors TD1 and TD2 are turned on, in all the pixels P, charges are simultaneously read out from the photodiodes PD1 and PD2 to the diodes MD1 and MD2.

Thereafter, when the reset signal RESET is rising edge-triggered in a state in which the reset potential VReset has the high level, extra charges, in the floating diffusion FD, generated by a leakage current or the like are reset as the reset transistor TB1 is turned on. Further, a voltage corresponding to the reset level of the floating diffusion FD is applied to the gate of the detecting transistor TA1. Here, the detecting transistor TA1 configures the source follower together with the load circuit 3 through the vertical signal line Vlin, the voltage of the vertical signal line Vlin follows the voltage applied to the gate of the detecting transistor TA1, and the pixel signal Vsig of the reset level is output to the column ADC circuit 4 via the vertical signal line Vlin.

Then, in the column ADC circuit 4, when the ramp wave is applied as the reference voltage VREF in a state in which the pixel signal Vsig of the reset level is input, the pixel signal Vsig of the reset level is compared with the ramp wave.

Then, as down-counting is performed until the pixel signal Vsig of the reset level matches the level of the ramp wave, the pixel signal Vsig of the reset level is converted into a digital value and then stored.

Next, when the read signal Read1 is rising edge-triggered, the read transistor TC1 is turned on, charges accumulated in the diode MD1 are transferred to the floating diffusion FD, a voltage corresponding to the signal level of the floating diffusion FD is applied to the gate of the detecting transistor TA1. Here, the detecting transistor TA1 configures the source follower together with the load circuit 3 through the vertical signal line Vlin, the voltage of the vertical signal line Vlin follows the voltage applied to the gate of the detecting transistor TA1, and the output voltage of the signal level is output to the column ADC circuit 4 via the vertical signal line Vlin as the pixel signal Vsig.

Then, in the column ADC circuit 4, when the ramp wave is applied as the reference voltage VREF in a state in which the output voltage Vsig of the signal level is input, the output voltage Vsig of the signal level is compared with the ramp wave.

Then, as up-counting is now performed until the output voltage Vsig of the signal level matches the level of the ramp wave, the difference between the output voltage Vsig of the signal level and the output voltage Vsig of the reset level is converted into a digital value, and then the output signal S1 in which the reset level of each cell and Vth variation of the detecting transistor TA1 are removed by the CDS operation is output.

Next, when the reset signal RESET is rising edge-triggered in a state in which the reset potential VReset has the low level, the reset transistor TB1 is turned on, the potential of the floating diffusion FD is set to the low level. For this reason, the detecting transistor TA1 is turned off, and the voltage of the vertical signal line Vlin does not follow the potential of the floating diffusion FD.

Here, as the charge accumulating layers MA1 and MA2 are formed in the photoelectric converting layers PA1 and PA2, respectively, the charge accumulation operation of the photoelectric converting layers PA1 and PA2 of all the pixels P is simultaneously started, and charges are simultaneously read out the photoelectric converting layers PA1 and PA2 of all the pixels P to the charge accumulating layers MA1 and MA2, even while the subject is being moved, rolling shutter distortion in which the subject is obliquely imaged can be avoided.

Figure 3:
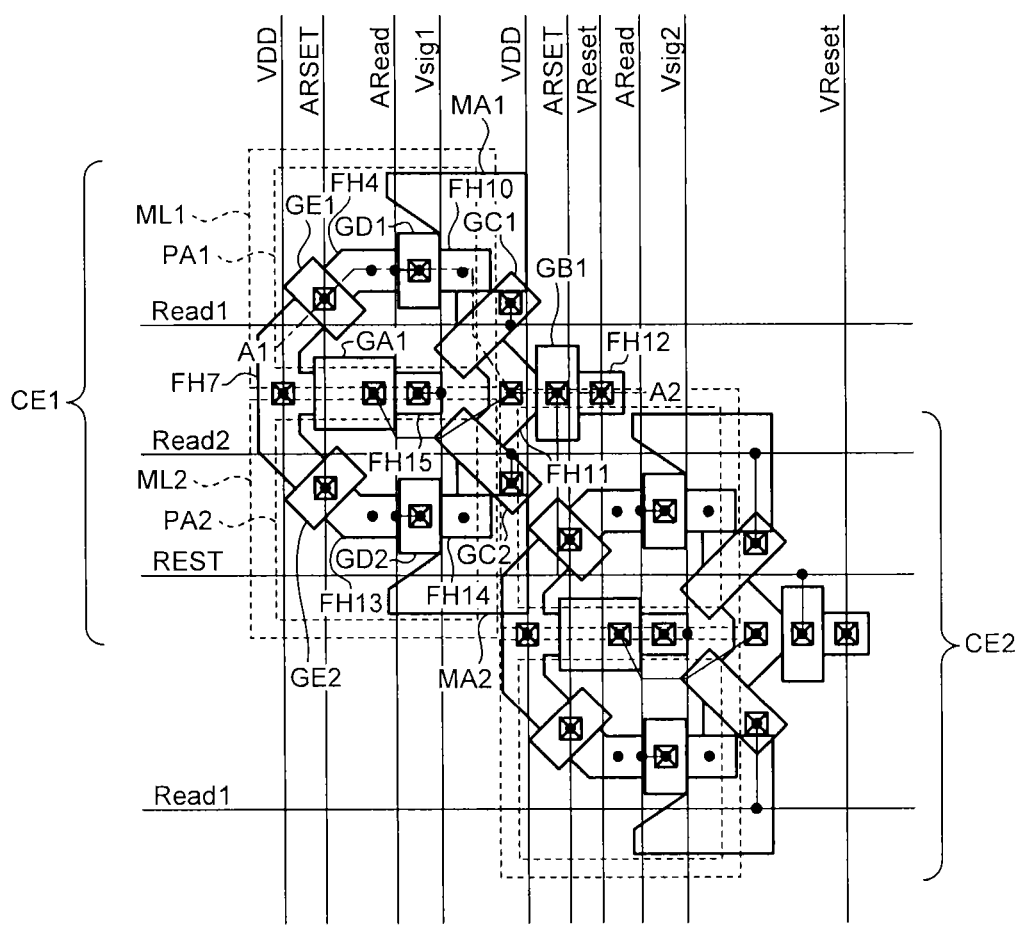
FIG. 3 is a plane view illustrating the layout structure of the two-pixel one-cell structure of FIG. 2.

FIG. 3 is a plane view illustrating the layout structure of the two-pixel one-cell structure of FIG. 2.

Referring to FIG. 3, a cell CE1 includes the photoelectric converting layers PA1 and PA2 and the charge accumulating layers MA1 and MA2. Here, the photoelectric converting layers PA1 and PA2 may be disposed on the back surface side of the semiconductor substrate, and the charge accumulating layers MA1 and MA2 may be disposed on the front surface side of the semiconductor substrate. The photoelectric converting layers PA1 and PA2 may at least partially overlap the charge accumulating layers MA1 and MA2. The microlenses ML1 and ML2 are disposed on the photoelectric converting layers PA1 and PA2, respectively. The microlenses ML1 and ML2 can make light incident to the back surface side of the semiconductor substrate to be collected on the photoelectric converting layers PA1 and PA2 not to be incident to the charge accumulating layers MA1 and MA2.

Further, the cell CE1 includes gate electrodes GA1, GB1, GC1, GC2, GD1, GD2, GE1, and GE2. The gate electrodes GA1, GB1, GC1, GC2, GD1, GD2, GE1, and GE2 may be disposed on the front surface side of the semiconductor substrate. The gate electrode GA1 may configure the detecting transistor TA1, the gate electrode GB1 may configure the reset transistor TB1, the gate electrodes GC1 and GC2 may configure the read transistors TC1 and TC2, respectively, the gate electrodes GD1 and GD2 may configure the global read transistors TD1 and TD2, respectively, and the gate electrodes GE1 and GE2 may configure the global reset transistors TE1 and TE2, respectively.

An impurity diffusion layer FH7 is formed between the gate electrodes GE1 and GE2 and the gate electrode GA1, an impurity diffusion layer FH4 is formed between the gate electrode GE1 and the gate electrode GD1, an impurity diffusion layer FH10 is formed between the gate electrode GD1 and the gate electrode GC1, an impurity diffusion layer FH11 is formed between the gate electrodes GC1 and GC2 and the gate electrode GB1, an the impurity diffusion layer FH13 is formed between the gate electrode GE2 and the gate electrode GD2, and an impurity diffusion layer FH14 is formed between the gate electrode GD2 and the gate electrode GC2. An impurity diffusion layer FH15 is formed on the side opposite to the impurity diffusion layer FH7 with the gate electrode GA1 interposed therebetween. An impurity diffusion layer FH12 is formed on the side opposite to the impurity diffusion layer FH11 with the gate electrode GB1 interposed therebetween.

Here, the photoelectric converting layers PA1 and PA2 may be arranged to be symmetric to each other in the column direction CD centering on the detecting transistor TA1, and the charge accumulating layers MA1 and MA2 may be arranged to be symmetric to each other in the column direction CD centering on the detecting transistor TA1. The read transistors TC1 and TC2, the global read transistors TD1 and TD2, and the global reset transistors TE1 and TE2 may be arranged to be symmetric to one another in the column direction CD centering on the detecting transistor TA1, respectively. The detecting transistor TA1 may be arranged to be surrounded by the read transistors TC1 and TC2, the global read transistors TD1 and TD2, and the global reset transistors TE1 and TE2. The cells CE1 and CE2 may be arranged to be adjacent to each other in a direction inclined to the column direction CD at 45°.

An interconnection used to transfer the global reset signal. ARSET is connected to the gate electrodes GE1 and GE2, an interconnection used to transfer the global read signal ARead is connected to the gate electrodes GD1 and GD2, an interconnection used to transfer the reset potential VReset is connected to the impurity diffusion layer FH12, an interconnection used to transfer the power potential VDD is connected to the impurity diffusion layer FH7, an interconnection used to transfer the pixel signal Vsig1 is connected to the impurity diffusion layer FH15, an interconnection used to transfer the read signal Read1 is connected to the gate electrode GC1, an interconnection used to transfer the read signal Read2 is connected to the gate electrode GC2, and an interconnection used to transfer the reset signal RESET is connected to the gate electrode GB1. The gate electrode GA1 is connected to the impurity diffusion layer FH11.

Here, since the cells CE1 and CE2 are arranged to be adjacent to each other in a direction inclined to the column direction CD at 45°, the interconnection used to transfer the read signals Read1 and Read2 and the interconnection used to transfer the reset signal RESET can be shared between the cells CE1 and CE2. Thus, the interconnection used to transfer the read signals Read1 and Read2 and the interconnection used to transfer the reset signal RESET need not be separately disposed in the cells CE1 and CE2, and thus the number of interconnections can be reduced.

Figure 4:
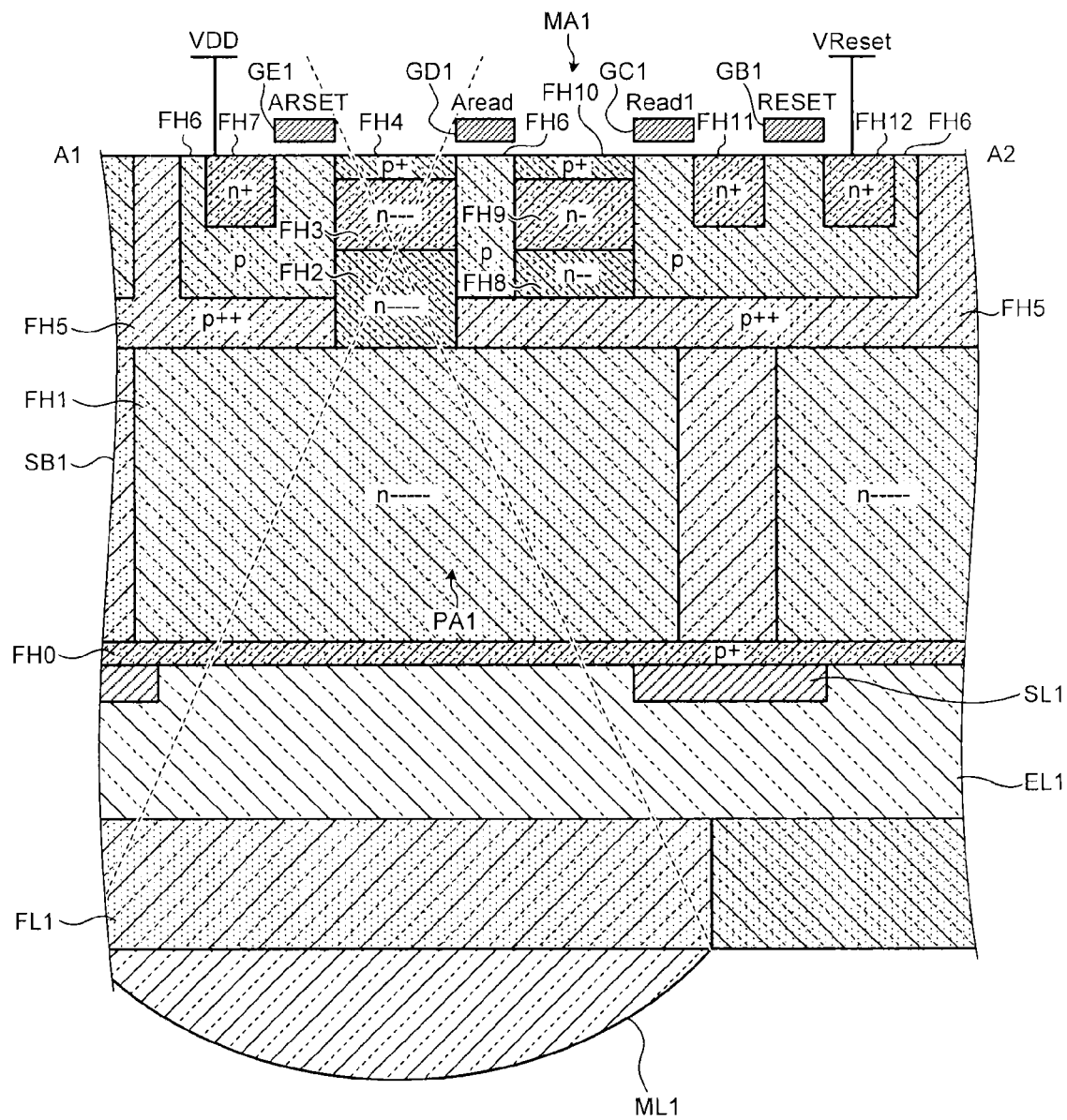
FIG. 4 is a cross-sectional view taken along line A1-A2 of FIG. 3.

FIG. 4 is a cross-sectional view taken along line A1-A2 of FIG. 3.

Referring to FIG. 4, an impurity diffusion layer FH1 is formed at the back surface side of a semiconductor substrate SB1, and an impurity diffusion layer FH0 is formed on the uppermost layer of the back surface side of the semiconductor substrate SB1. A P well FH5 is formed on the front surface side of the semiconductor substrate SB1, and a P well FH6 is formed in the P well FH5. The P well FH5 may be formed to be higher in impurity concentration than the P well FH6. The gate electrodes GB1, GC1, GD1, and GE1 are formed above the P well FH6. In the P well FH6, the impurity diffusion layer FH4 is formed between the gate electrodes GE1 and GD1, the impurity diffusion layer FH10 is formed between the gate electrodes GD1 and GC1, and the impurity diffusion layer FH11 is formed between the gate electrodes GC1 and GB1. Further, in the P well FH6, the impurity diffusion layer FH6 is formed at the side opposite to the impurity diffusion layer FH4 with the gate electrode GE1 interposed therebetween, and the impurity diffusion layer FH12 is formed at the side opposite to the impurity diffusion layer FH11 with the gate electrode GB1 interposed therebetween. Impurity diffusion layers FH3 and FH2 are sequentially formed in the depth direction between the impurity diffusion layer FH4 and FH1. In the P well FH6, impurity diffusion layers FH9 and FH8 are sequentially formed in the depth direction below the impurity diffusion layer FH10. The impurity diffusion layers FH1, FH2, FH3, FH7, FH8, FH9, FH11, and FH12 may have an n type, and the impurity diffusion layers FH0, FH4, and FH10 may have a p type. The impurity diffusion layers FH1, FH2, FH3, FH8, and FH9 may be formed to increase in the impurity concentration in the described order. The photoelectric converting layer PA1 may be arranged to at least partially overlap the charge accumulating layer MA1. The photoelectric converting layer PA1 may be separated from the charge accumulating layer MA1 by the P well FH5.

On the back surface side of the semiconductor substrate SB1, a transparent layer EL1 is formed on the impurity diffusion layer FH0, and a microlens ML1 is formed over the transparent layer EL1 with a color filter FL1 interposed therebetween. A light blocking layer SL1 is buried in the transparent layer EL1. The transparent layer EL1 may be made of transparent resin such as acrylic. The light blocking layer SL1 may be made of metal such as Al. The microlens ML1 may make light incident to the back surface side of the semiconductor substrate SB1 to be collected on the photoelectric converting layer PA1 not to be incident to the charge accumulating layer MA1. The light blocking layer SL1 can block light incident to the back surface side of the semiconductor substrate SB1 from being incident to the charge accumulating layer MA1. The transparent layer EL1 increases an interval between the photoelectric converting layer PA1 and the microlens ML1, and thus an incident angle of light incident to the photoelectric converting layer PA1 can be reduced. When the transparent layer EL1 has the thickness of 0.5 um or more, there is an effect by which light harvesting on the photoelectric converting layer PA1 is improved.

Here, as the photoelectric converting layer PA1 is arranged to at least partially overlap the charge accumulating layer MA1, the size of the pixel P can be reduced while supporting the global shutter structure. Further, as the light blocking layer SL1 is formed at the back surface side of the semiconductor substrate SB1, light incident to the back surface side of the semiconductor substrate SB1 can be prevented from being incident to the charge accumulating layer MA1. Furthermore, as the transparent layer EL1 is formed at the back surface side of the semiconductor substrate SB1, an incident angle of light incident to the photoelectric converting layer PA1 can be reduced, and light to be collected on the photoelectric converting layer PA1 can be prevented from leaking to the charge accumulating layer MA1. In addition, as the impurity diffusion layer FH0 is formed on the uppermost layer of the back surface side of the semiconductor substrate SB1, a leakage current leaking to the charge accumulating layer MA1 can be reduced.

Further, as the P well in the front surface side of the semiconductor substrate SB1 has a dual-layer structure, and the P well FH5 separating the photoelectric converting layer PA1 from the charge accumulating layer MA1 is higher in the impurity concentration than the P well FH6 in which a channel is formed, isolation between the photoelectric converting layer PA1 and the charge accumulating layer MA1 can be improved. Further, as the P well FH5 is formed, the capacity of the photoelectric converting layer PA1 and the charge accumulating layer MA1 can be increased, the number of saturated electrons can be increased, and charges generated in the boundary between the photoelectric converting layer PA1 and the charge accumulating layer MA1 can be easily taken into the photoelectric converting layer PA1.

Figure 5:
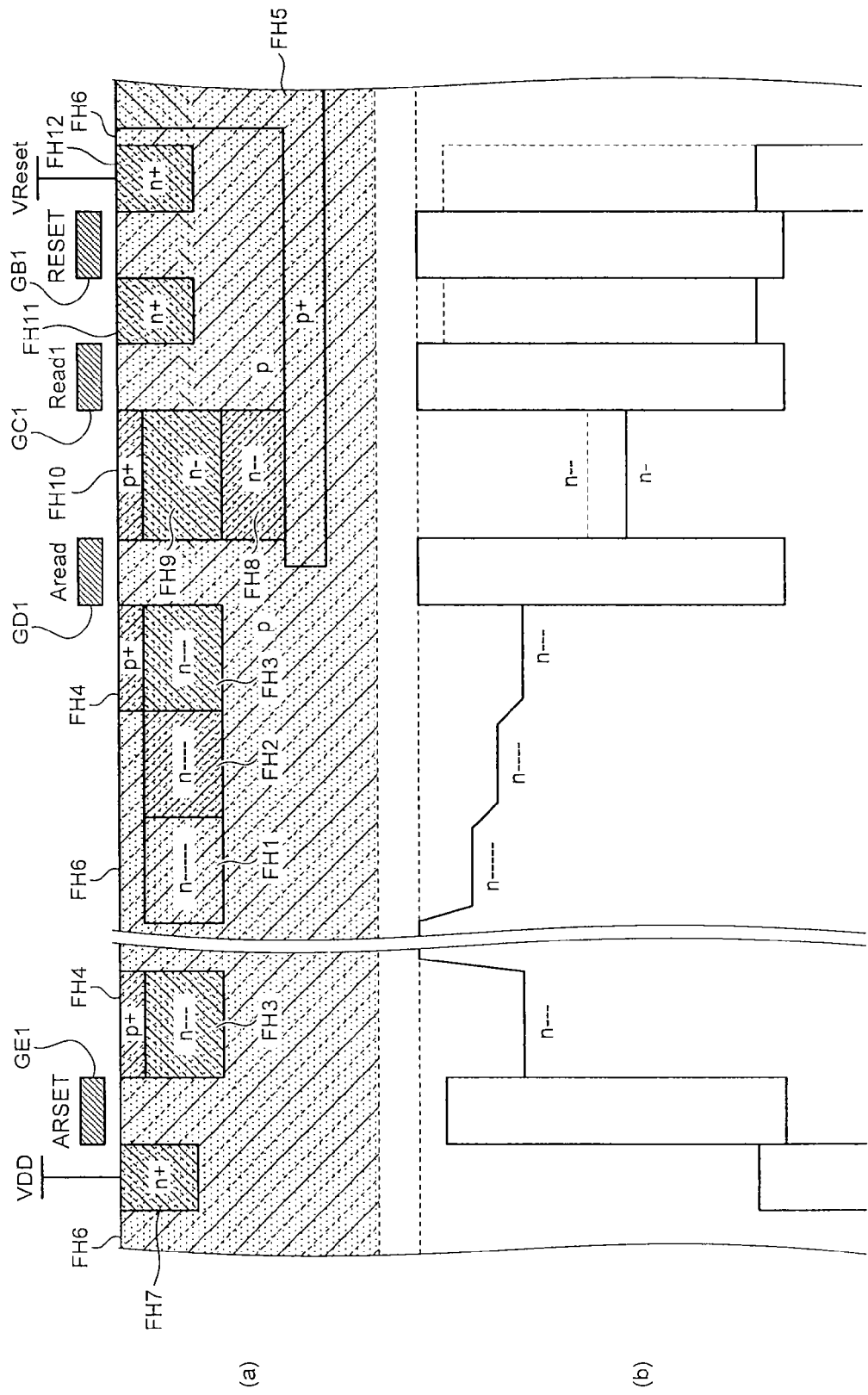
FIG. 5A is a cross-sectional view illustrating a configuration in which an impurity diffusion layer of a photoelectric converting layer of FIG. 4 is developed in a horizontal direction.
FIG. 5B is a diagram illustrating the potential distribution of the configuration illustrated in FIG. 5A.

FIG. 5A is a cross-sectional view illustrating a configuration in which the impurity diffusion layer of the photoelectric converting layer of FIG. 4 is developed in the horizontal direction, and FIG. 5B is a diagram illustrating the potential distribution of the configuration illustrated in FIG. 5A.

Referring to FIG. 5A, the impurity diffusion layers FH1, FH2, and FH3 are set to increase in the impurity concentration in the described order, and the potential gradient is formed from the back surface side of the semiconductor substrate SB1 toward the front surface side thereof. Thus, charges generated at the back surface side of the photoelectric converting layer PA1 can be collected at the front surface side thereof, and charges can be smoothly transferred from the photoelectric converting layer PA1 to the charge accumulating layer MA1.

When the photoelectric converting layer PA1 starts to accumulate, as the global reset signal ARSET is rising edge-triggered, extra signal charges accumulated in the photoelectric converting layer PA1 are discharged. During the accumulation operation of the photoelectric converting layer PA1, signal charges are accumulated such that the signal charges photoelectric-converted by the photoelectric converting layer PA1 flow to the impurity diffusion layer FH3 side having the deep potential, and the signal charge overflowing over the impurity diffusion layer FH3 are spread to the impurity diffusion layers FH2 and FH1. At this time, the global reset signal ARSET is set to a low voltage of 0.2 V to 0.5 V, the global read signal Aread, the read signal Read1, and the reset signal RESET are set to 0 V. Alternatively, the global reset signal ARSET is set to 0 V, and the global read signal Aread, the read signal Read1, and the reset signal RESET are set to −1.0 to −0.5 V. As a result, when intense light is incident to the photoelectric converting layer PA1, the photoelectric converting layer PA1 is saturated. At this time, the saturated or more signal charges flow to the power potential VDD via the gate electrode GE1, and thus the signal charges overflowing in the photoelectric converting layer PA1 can be prevented from flowing to the charge accumulating layer MA1 (an overflow drain structure).

Further, as the global read signal Aread is rising edge-triggered, the signal charges accumulated in the photoelectric converting layer PA1 are read out to the charge accumulating layer MA1. At this time, the potentials of the photoelectric converting layer PA1 and the charge accumulating layer MA1 are set to be getting deeper in the order of the impurity diffusion layer FH1→the impurity diffusion layer FH2→the impurity diffusion layer FH3→the impurity diffusion layer FH8→the impurity diffusion layer FH9, and thus the signal charges of the photoelectric converting layer PA1 can be smoothly and completely read out. The signal charges overflowing from the impurity diffusion layer FH9 of the charge accumulating layer MA1 can be accumulated in the large area of the impurity diffusion layer FH8. Further, since the impurity diffusion layer FH8 comes into contact with the impurity diffusion layer FH5, the capacity can be further increased.

Since the potential of the floating diffusion FD is shallow, that is, 0.5 V before signal reading of the charge accumulating layer MA1, the floating diffusion FD is reset by causing the reset potential VReset to be equal to the power potential VDD and causing the reset signal RESET to be rising edge-triggered. Then, as the read signal Read1 is rising edge-triggered, the signal charges accumulated in the charge accumulating layer MA1 are read out. Since the potential of the floating diffusion FD is deeper than the potential of the impurity diffusion layer FH9 of the charge accumulating layer MA1, all the signal charges of the charge accumulating layer MA1 can be read out. The charges read out to the floating diffusion FD are converted into a voltage by the detecting transistor TA1 and then output as the pixel signal Vsig1.

Then, by causing the reset potential VReset to be 0.2 to 0.5 V and causing the reset signal RESET to be rising edge-triggered, the floating diffusion FD is set to 0.2 to 0.5 V, and the detecting transistor TA1 is turned off. For example, when the power potential VDD is 2.8 V, an ON voltage of each gate is set to 3.6 V obtained by increasing the power potential VDD, and thus large signal charges can be output.

Figure 6:
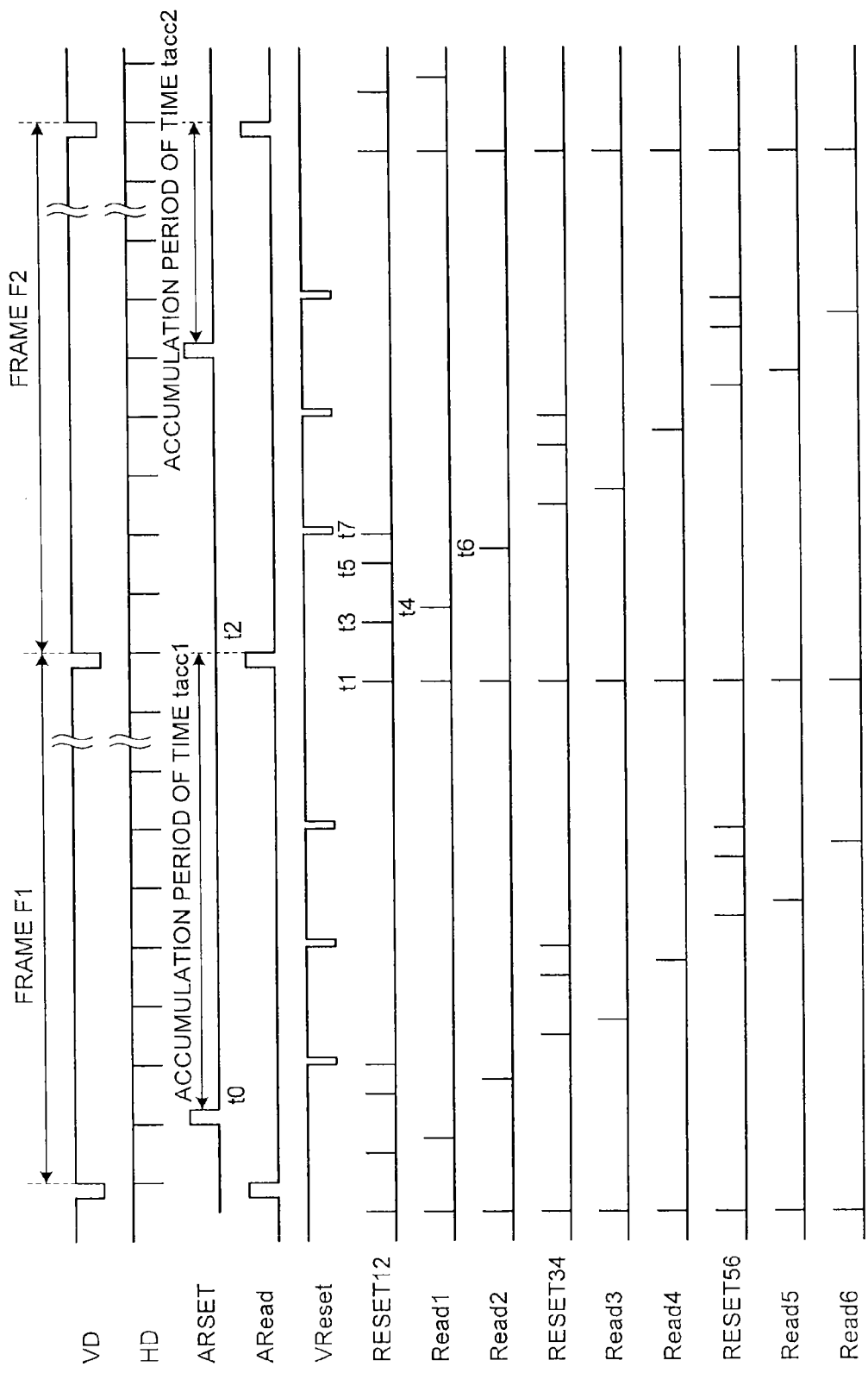
FIG. 6 is a timing chart illustrating an operation of components of the two-pixel one-cell structure of FIG. 2.

FIG. 6 is a timing chart illustrating an operation of the components of the two-pixel one-cell structure of FIG. 2.

Referring to FIG. 6, at a time t0, the global reset signal ARSET is rising edge-triggered on all the pixels P at the same time according to a horizontal synchronous signal HD, and signals are read out of the photoelectric converting layers PA1 and PA2 of all the pixels P and discharged to the power potential VDD. Then, the global reset signal ARSET is falling edge-triggered, and the photoelectric converting layers PA1 and PA2 of all the pixels P start the accumulation operation at the same time.

At a time t1, reset signals RESET12, RESET34, RESET56, and the like of all the pixels P and read signals Read1, Read2, Read3, Read4, Read5, Read6, and the like are rising edge-triggered at the same time, and the extra signal charges (a leakage current, a flaw, or the like) remaining in the charge accumulating layers MA1 and MA2 are discharged to the reset potential VReset through the reset transistor TB1.

The reset signal RESET12 is supplied to the pixels P of a first line and a second line, the reset signal RESET34 is supplied to the pixels P of a third line and a fourth line, and the reset signal RESET56 is supplied to the pixels P of a fifth line and a sixth line. The read signal Read1 is supplied to the pixels P of the first line, the read signal Read2 is supplied to the pixels P of the second line, the read signal Read3 is supplied to the pixels P of the third line, the read signal Read4 is supplied to the pixels P of the fourth line, the read signal Read5 is supplied to the pixels P of the fifth line, and the read signal Read6 is supplied to the pixels P of the sixth line.

At a time t2, as the global read signal ARead is rising edge-triggered on all the pixels P at the same time, the signal charges photoelectric-converted by the photoelectric converting layers PA1 and PA2 and accumulated are read out to the charge accumulating layers MA1 and MA2. At this time, "t2-t0" may be given as an accumulation period of time tacc1. Further, at this time, the vertical synchronous signal is rising edge-triggered, and a frame is switched from F1 to F2.

At a time t3, the reset signal RESET12 is rising edge-triggered, and the extra signal charges (a leakage current, a flaw, or the like) remaining in the floating diffusions FD of the pixels P of the first line and the second line are discharged to the reset potential VReset through the reset transistor TB1. At this time, the voltage of the reset potential VReset may be set to the same voltage as the power potential VDD.

At a time t4, the read signal Read1 is rising edge-triggered, and the signal charges accumulated in the charge accumulating layer MA1 of the first line are read out to the floating diffusion FD. The signal charges read out to the floating diffusion FD are converted into a voltage by the detecting transistor TA1 and output as the pixel signal Vsig. At this time, it is possible to extract only the image signal component by the CDS operation for obtaining the difference between the pixel signal Vsig of the reset level when the reset signal RESET12 is rising edge-triggered and the pixel signal Vsig of the signal level when the read signal Read1 is rising edge-triggered.

At a time t5, the reset signal RESET12 is rising edge-triggered, and the extra signal charges (a leakage current, a flaw, or the like) remaining in the floating diffusions FD of the pixels P of the first line and the second line are discharged to the reset potential VReset through the reset transistor TB1. At this time, the voltage of the reset potential VReset may be set to the same voltage as the power potential VDD.

At a time t6, the read signal Read2 is rising edge-triggered, and the signal charges accumulated in the charge accumulating layer MA2 of the second line are read out to the floating diffusion FD. The signal level in which the signal charges read out to the floating diffusion FD are converted into a voltage by the detecting transistor TA1 is output as the pixel signal Vsig.

At a time t7, the reset signal RESET12 is falling edge-triggered to 0.5 V or less, and the detecting transistor TA1 is turned off. Alternatively, an address transistor may be disposed at the power potential VDD side or the vertical signal line Vlin side of the detecting transistor TA1, and an OFF setting may be performed by turning off the address transistor.

Similarly, an operation of from the time t3 to the time t7 is executed in the vertical direction for each line, and the signals accumulated in the charge accumulating layers MA1 and MA2 can be read out on all the pixels P.

Figure 7:
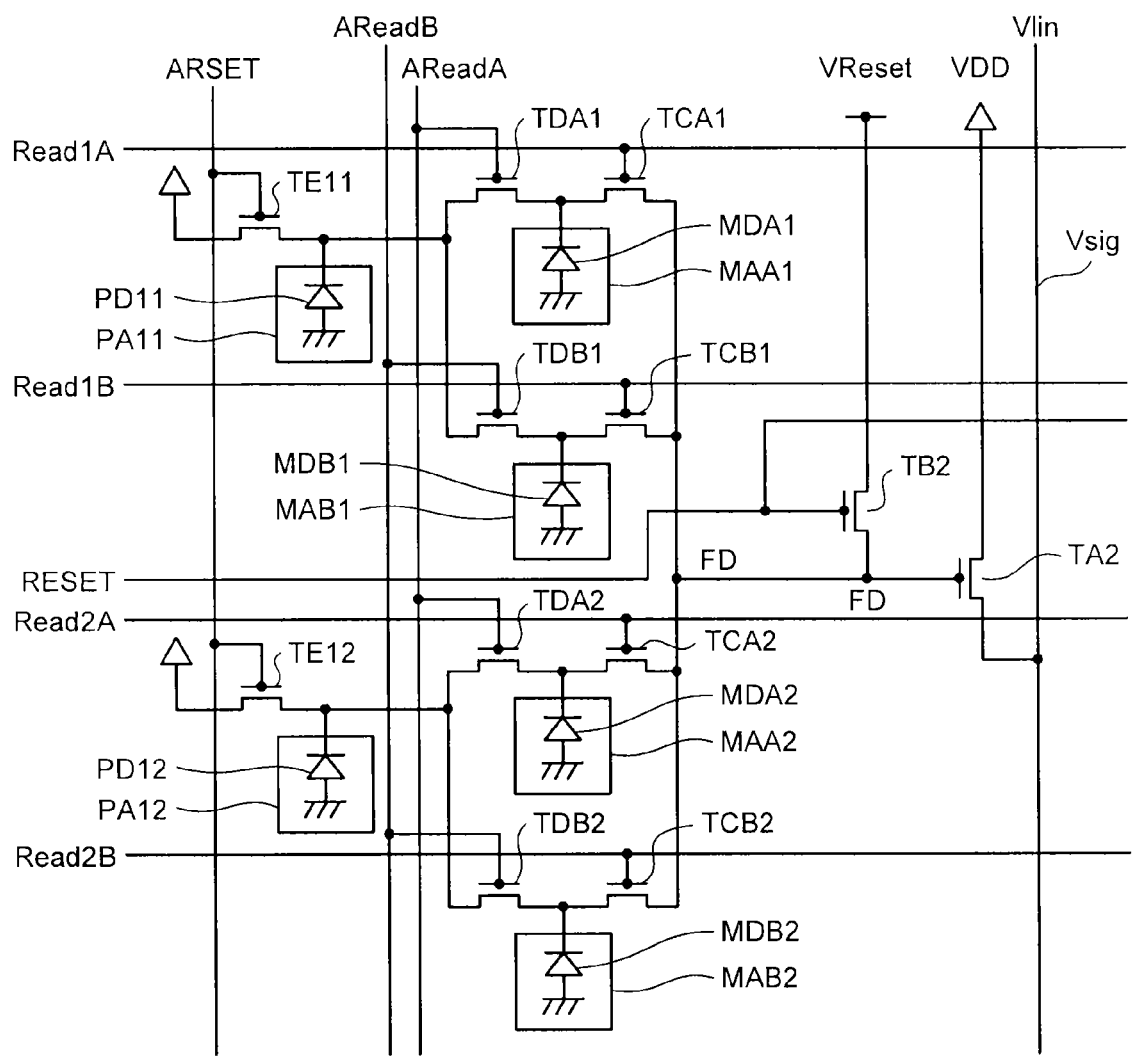
FIG. 7 is a circuit diagram illustrating a schematic configuration of a two-pixel one-cell structure according to a second embodiment.

FIG. 7 is a circuit diagram illustrating a schematic configuration of a two-pixel one-cell structure according to a second embodiment.

Referring to FIG. 7, a cell includes photoelectric converting layers PA11 and PA12, charge accumulating layers MAA1, MAB1, MAA2, and MAB2, a detecting transistor TA2, a reset transistor TB2, read transistors TCA1, TCB1, TCA2, and TCB2, global reset transistors TE11 and TE12, and global read transistors TDA1, TDB1, TDA2, and TDB2. A floating diffusion FD is formed at a connection point among the detecting transistor TA2, the reset transistor TB2, and the read transistors TCA1, TCB1, TCA2, and TCB2 as a detection node. Here, photodiodes PD11 and PD12 are formed in the photoelectric converting layers PA11 and PA12, respectively, and diodes MDA1, MDB1, MDA2, and MDB2 are formed in the charge accumulating layers MAA1, MAB1, MAA2, and MAB2, respectively.

Here, the photoelectric converting layer PA11, the charge accumulating layers MAA1 and MAB1, the read transistors TCA1 and TCB1, the global reset transistor TE11, and the global read transistors TDA1 and TDB1 may belong to one pixel P of the cell, and the photoelectric converting layer PA12, the charge accumulating layers MAA2 and MAB2, the read transistors TCA2 and TCB2, the global read transistor TE12, and the global read transistors TDA2 and TDB2 may belong to the other pixel P of the cell. The floating diffusion FD, the detecting transistor TA2, and the reset transistor TB2 are shared by the two pixels P of the cell.

The global read transistor TDA1 and the read transistor TCA1 are connected in series, the global read transistor TDB1 and the read transistor TCB1 are connected in series, and the series circuits are connected to the global reset transistor TE11 in parallel. The photodiode PD11 is connected to a connection point among the global reset transistor TE11 and the global read transistors TDA1 and TDB1, and the diode MDA1 is connected to a connection point between the global read transistor TDA1 and the read transistor TCA1.

The global read transistor TDA2 and the read transistor TCA2 are connected in series, the global read transistor TDB2 and the read transistor TCB2 are connected in series, and the series circuits are connected to the global reset transistor TE12 in parallel. The photodiode PD12 is connected to a connection point among the global reset transistor TE12 and the global read transistors TDA2 and TDB2, and the diode MDA2 is connected to a connection point between the global read transistor TDA2 and the read transistor TCA2.

Sources of the read transistors TCA1, TCB1, TCA2, and TCB2, a gate of the detecting transistor TA2, and a source of the reset transistor TB2 are connected to the floating diffusion FD.

A global reset signal ARSET is input to gates of the global reset transistors TE11 and TE12, a global read signal AReadA is input to gates of the global read transistors TDA1 and TDA2, and a global read signal AReadB is input to gates of the global read transistors TDB1 and TDB2. Read signals Read1A, Read1B, Read2A, and Read2B are input to gates of the read transistors TCA1, TCB1, TCA2, and TCB2, respectively, and a reset signal RESET is input to a gate of the reset transistor TB2. A reset potential VReset is input to a drain of the reset transistor TB2, a power potential VDD is input to a drain of the detecting transistor TA2, and a pixel signal Vsig is output from a source of the detecting transistor TA2 to the vertical signal line Vlin.

Here, when a plurality of charge accumulating layers MAA1, MAB1, MAA2, and MAB2 are formed in parallel for every photoelectric converting layers PA1 and PA2, the number of saturated electrons can be increased to twice, two signals that differ in an accumulation period of time can be obtained, and thus the dynamic range can be increased. Further, a difference is brought about between the accumulation periods of time, charges are read out from the photoelectric converting layer PA11 to the charge accumulating layers MAA1 and MAB1, and a differential output is obtained by signal processing, and thus only a signal of a moving subject can be obtained.

Figure 8:
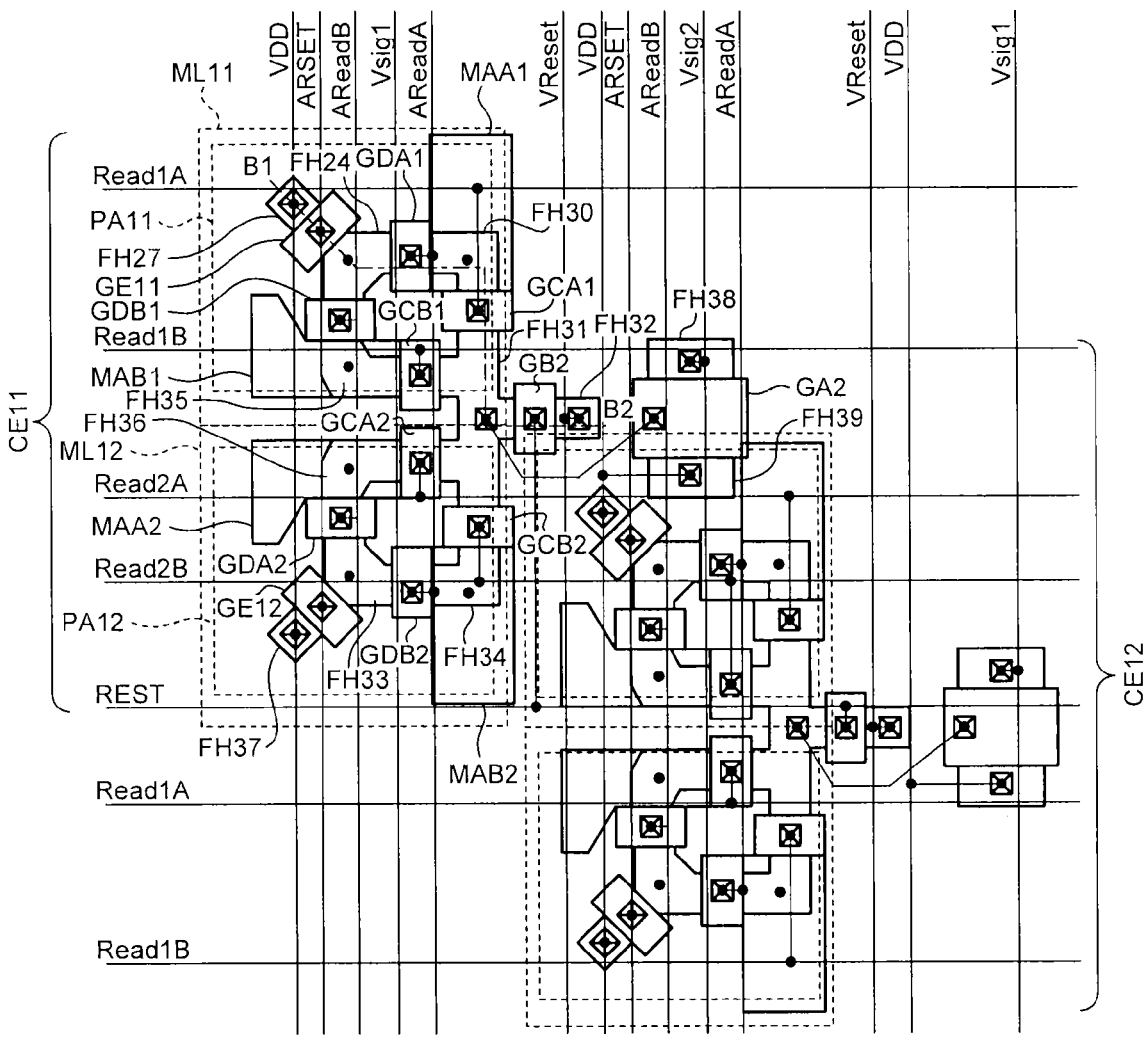
FIG. 8 is a plane view illustrating the layout structure of the two-pixel one-cell structure of FIG. 7.

FIG. 8 is a plane view illustrating the layout structure of the two-pixel one-cell structure of FIG. 7.

Referring to FIG. 8, a cell CE11 includes the photoelectric converting layers PA11 and PA12 and the charge accumulating layers MAA1, MAB1, MAA2, and MAB2. Here, the photoelectric converting layers PA11 and PA12 may be disposed on the back surface side of the semiconductor substrate, and the charge accumulating layers MAA1, MAB1, MAA2, and MAB2 may be disposed on the front surface side of the semiconductor substrate. The photoelectric converting layers PA11 and PA12 may at least partially overlap the charge accumulating layers MAA1, MAB1, MAA2, and MAB2. Microlenses ML11 and ML12 are disposed on the photoelectric converting layers PA11 and PA12, respectively. The microlenses ML11 and ML12 may make light incident to the back surface side of the semiconductor substrate to be collected on the photoelectric converting layers PA11 and PA12 not to be incident to the charge accumulating layers MAA1, MAB1, MAA2, and MAB2.

Further, the cell CE11 includes gate electrodes GA2, GB2, GCA1, GCB1, GCA2, GCB2, GDA1, GDA2, GDB1, GDB2, GE11, and GE12. The gate electrodes GA2, GB2, GCA1, GCB1, GCA2, GCB2, GDA1, GDA2, GDB1, GDB2, GE11, and GE12 may be disposed on the front surface side of the semiconductor substrate. The gate electrode GA2 may configure the detecting transistor TA2, the gate electrode GB2 may configure the reset transistor TB2, the gate electrodes GCA1, GCB1, GCA2, and GCB2 may configure the read transistors TCA1, TCB1, TCA2, and TCB2, respectively, the gate electrodes GDA1, GDB1, GDA2, and GDB2 may configure the global read transistors TDA1, TDB1, TDA2, and TDB2, respectively, and the gate electrode GE11 and GE12 may configure the global reset transistors TE11 and TE12, respectively.

An impurity diffusion layer FH24 is formed between the gate electrode GE11 and the gate electrode GDA1, GDB1, an impurity diffusion layer FH30 is formed between the gate electrode GDA1 and the gate electrode GCA1, an impurity diffusion layer FH35 is formed between the gate electrode GDB1 and the gate electrode GCB1, an impurity diffusion layer FH33 is formed between the gate electrode GE12 and the gate electrodes GDA2 and GDB2, an impurity diffusion layer FH36 is formed between the gate electrode GDA2 and the gate electrode GCA2, an impurity diffusion layer FH34 is formed between the gate electrode GDB2 and the gate electrode GCB2, and an impurity diffusion layer FH31 is formed between the gate electrodes GCA1, GCB1, GCA2, and GCB2 and the gate electrode GB2. An impurity diffusion layer FH27 is formed at the side opposite to the impurity diffusion layer FH24 with the gate electrode GE11 interposed therebetween, an impurity diffusion layer FH37 is formed at the side opposite to the impurity diffusion layer FH33 with the gate electrode GE12 interposed therebetween, and an impurity diffusion layer FH32 is formed at the side opposite to the impurity diffusion layer FH31 with the gate electrode GB2 interposed therebetween. Impurity diffusion layers FH38 and FH39 are formed at both sides of the gate electrode GA2.

Here, the photoelectric converting layers PA11 and PA12 may be arranged to be symmetrical to each other in the column direction CD centering on the detecting transistor TA2, and the charge accumulating layers MAA1 and MAB1 and the charge accumulating layers MAA2 and MAB2 may be arranged to be symmetrical to each other in the column direction CD centering on the detecting transistor TA2, respectively. The read transistors TCA1, TCB1, TCA2, and TCB2, the global read transistors TDA1, TDB1, TDA2, and TDB2, and the global reset transistors TE11 and TE12 may be arranged to be symmetrical to each other in the column direction CD centering on the detecting transistor TA2, respectively. The gate electrodes GCA1, GCB1, GDA1, and GDB1 may be arranged on sides of a rectangle, respectively, and the gate electrodes GB2 and GE11 may be arranged at facing diagonal positions of a rectangle, respectively. The gate electrodes GCA2, GCB2, GDA2, and GDB2 may be arranged on sides of a rectangle, respectively, and the gate electrodes GB2 and GE12 may be arranged at facing diagonal positions of a rectangle, respectively. The cells CE11 and CE12 may be arranged to be adjacent to each other in a direction inclined to the column direction CD at 45°.

An interconnection used to transfer the global reset signal ARSET is connected to the gate electrodes GE11 and GE12, an interconnection used to transfer the global read signal AReadA is connected to the gate electrodes GDA1 and GDA2, an interconnection used to transfer the global read signal AReadB is connected to the gate electrodes GDB1 and GDB2, an interconnection used to transfer the reset potential VReset is connected to the impurity diffusion layer FH32, an interconnection used to transfer the power potential VDD is connected to the impurity diffusion layers FH27 and FH39, an interconnection used to transfer the pixel signal Vsig2 is connected to the impurity diffusion layer FH38, an interconnection used to transfer the read signal Read1A is connected to the gate electrode GCA1, an interconnection used to transfer the read signal Read1B is connected to the gate electrode GCB1, an interconnection used to transfer the read signal Read2A is connected to the gate electrode GCA2, an interconnection used to transfer the read signal Read2B is connected to the gate electrode GCB2, and an interconnection used to transfer the reset signal RESET is connected to the gate electrode GB2. The gate electrode GA2 is connected to the impurity diffusion layer FH31.

Here, since the cells CE11 and CE12 are arranged to be adjacent to each other in a direction inclined to the column direction CD at 45°, the interconnection used to transfer the read signals Read1A, Read1B, Read2A, and Read2B and the interconnection used to transfer the reset signal RESET can be shared between the cells CE11 and CE12. Thus, the interconnection used to transfer the read signals Read1A, Read1B, Read2A, and Read2B and the interconnection used to transfer the reset signal RESET need not be separately disposed in the cells CE11 and CE12, and thus the number of interconnections can be reduced.

Figure 9:
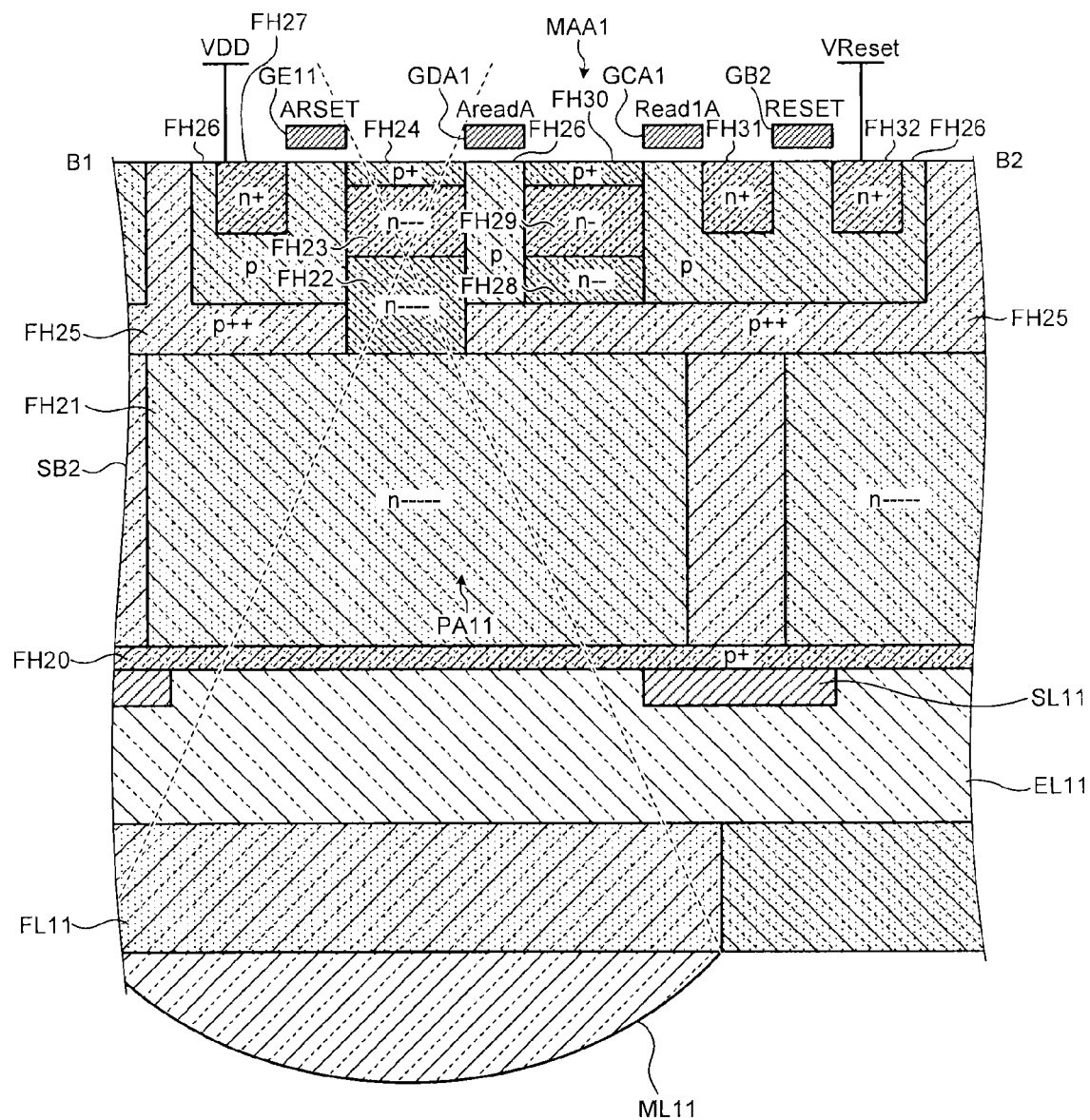
FIG. 9 is a cross-sectional view taken along line B1-B2 of FIG. 8.

FIG. 9 is a cross-sectional view taken along line B1-B2 of FIG. 8.

Referring to FIG. 9, an impurity diffusion layer FH21 is formed at the back surface side of a semiconductor substrate SB2, and an impurity diffusion layer FH20 is formed on the uppermost layer of the back surface side of the semiconductor substrate SB2. A P well FH25 is formed on the front surface side of the semiconductor substrate SB2, and a P well FH26 is formed in the P well FH25. The P well FH25 may be formed to be higher in impurity concentration than the P well FH26. The gate electrodes GB2, GCA1, GDA1, and GE11 are formed above the P well FH26. In the P well FH26, the impurity diffusion layer FH24 is formed between the gate electrodes GE11 and GDA1, the impurity diffusion layer FH30 is formed between the gate electrodes GDA1 and GCA1, and the impurity diffusion layer FH31 is formed between the gate electrodes GCA1 and GB2. Further, in the P well FH26, the impurity diffusion layer FH26 is formed at the side opposite to the impurity diffusion layer FH24 with the gate electrode GE11 interposed therebetween, and the impurity diffusion layer FH32 is formed at the side opposite to the impurity diffusion layer FH31 with the gate electrode GB2 interposed therebetween. Impurity diffusion layers FH23 and FH22 are sequentially formed in the depth direction between the impurity diffusion layers FH24 and FH21. In the P well FH26, impurity diffusion layers FH29 and FH28 are sequentially formed in the depth direction below the impurity diffusion layer FH30. The impurity diffusion layers FH21, FH22, FH23, FH27, FH28, FH29, FH31, and FH32 may have an n type, and the impurity diffusion layers FH20, FH24, and FH30 may have a p type. The impurity diffusion layers FH21, FH22, and FH23 are formed to increase in the impurity concentration in the described order. The impurity diffusion layers FH29 and FH28 are formed to increase in the impurity concentration in the described order. The photoelectric converting layer PA11 may be arranged to at least partially overlap the charge accumulating layer MAA1. The photoelectric converting layer PA11 may be separated from the charge accumulating layer MAA1 by the P well FH25.

On the back surface side of the semiconductor substrate SB2, the transparent layer EL11 is formed on the impurity diffusion layer FH20, and a microlens ML11 is formed over the transparent layer EL11 with a color filter FL11 interposed therebetween. The light blocking layer SL11 is buried in the transparent layer EL11. The microlens ML11 may make light incident to the back surface side of the semiconductor substrate SB2 to be collected on the photoelectric converting layer PA11 not to be incident to the charge accumulating layer MAA1. The light blocking layer SL11 can block light incident to the back surface side of the semiconductor substrate SB2 from being incident to the charge accumulating layer MAA1. The transparent layer EL11 increase an interval between the photoelectric converting layer PA11 and the microlens ML11, and thus an incident angle of light incident to the photoelectric converting layer PA11 can be reduced.

Here, as the photoelectric converting layer PA11 is arranged to at least partially overlap the charge accumulating layer MAA1, the size of the pixel P can be reduced while supporting the global shutter structure. Further, as the light blocking layer SL11 is formed at the back surface side of the semiconductor substrate SB2, light incident to the back surface side of the semiconductor substrate SB2 can be prevented from being incident to the charge accumulating layer MAA1. Furthermore, as the transparent layer EL11 is formed at the back surface side of the semiconductor substrate SB2, an incident angle of light incident to the photoelectric converting layer PA11 can be reduced, and light to be collected on the photoelectric converting layer PA11 can be prevented from leaking to the charge accumulating layer MAA1. In addition, as the impurity diffusion layer FH20 is formed on the uppermost layer of the back surface side of the semiconductor substrate SB2, a leakage current leaking to the charge accumulating layer MAA1 can be reduced.

Further, as the P well in the front surface side of the semiconductor substrate SB2 has the dual-layer structure, and the P well FH25 separating the photoelectric converting layer PA11 from the charge accumulating layer MAA1 is higher in the impurity concentration than the P well FH26 in which a channel is formed, isolation between the photoelectric converting layer PA11 and the charge accumulating layer MAA1 can be improved. Further, as the P well FH25 is formed, the capacity of the photoelectric converting layer PA11 and the charge accumulating layer MAA1 can be increased, the number of saturated electrons can be increased, and charges generated in the boundary between the photoelectric converting layer PA11 and the charge accumulating layer MAA1 can be easily taken into the photoelectric converting layer PA11.

The potential distribution of the impurity diffusion layers of the photoelectric converting layer and the charge accumulating layer of FIG. 9 is the same as in FIG. 5B. Here, the impurity diffusion layers FH21, FH22, and FH23 are set to increase in the impurity concentration in the described order, and the potential gradient is formed from the back surface side of the semiconductor substrate SB2 toward the front surface side thereof. Thus, charges generated at the back surface side of the photoelectric converting layer PA11 can be collected at the front surface side thereof, and charges can be smoothly transferred from the photoelectric converting layer PA11 to the charge accumulating layer MAA1.

Figure 10:
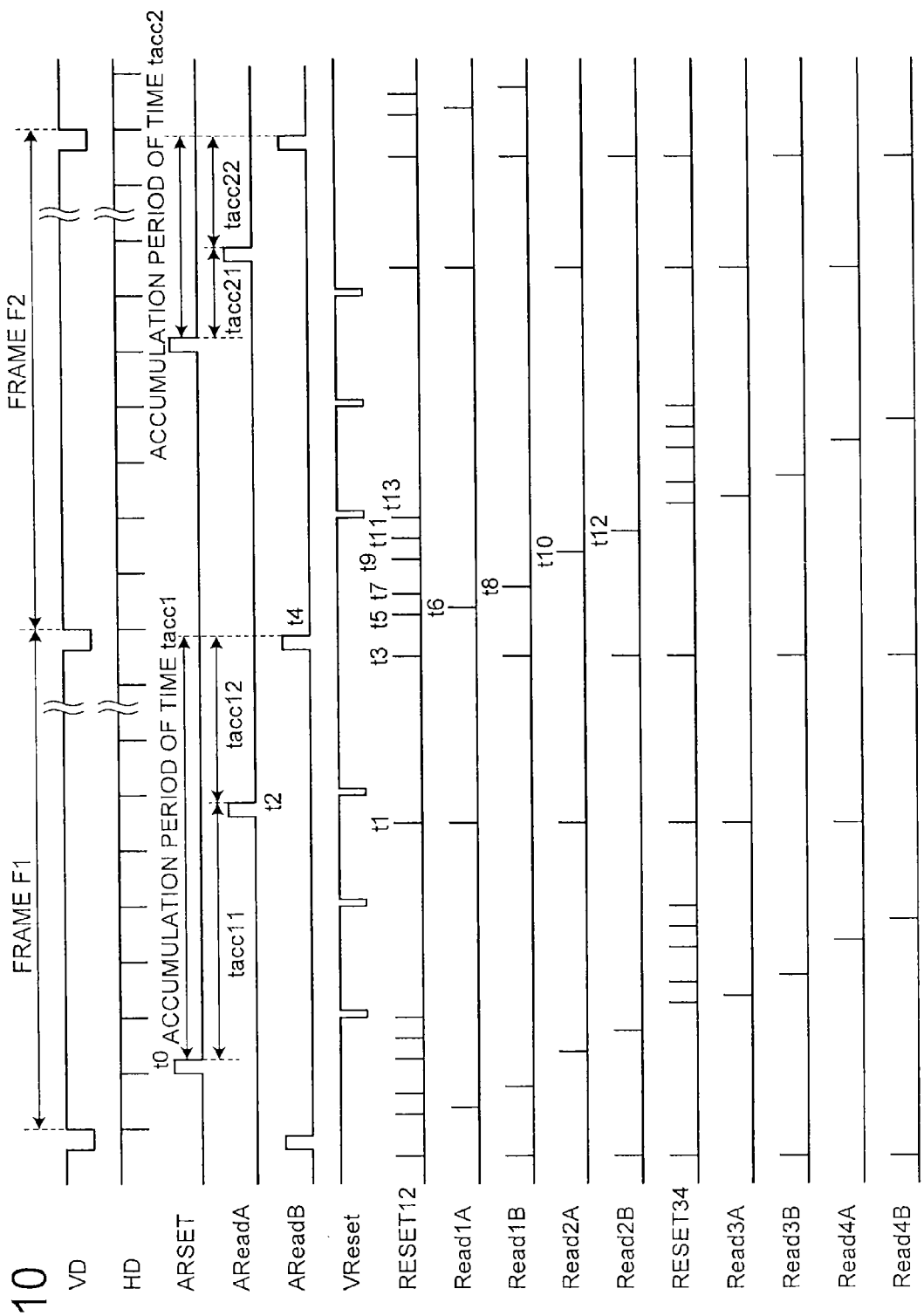
FIG. 10 is a timing chart illustrating an operation of components of the two-pixel one-cell structure of FIG. 7.

FIG. 10 is a timing chart illustrating an operation of the components of the two-pixel one-cell structure of FIG. 7.

Referring to FIG. 10, at a time t0, the global reset signal ARSET is rising edge-triggered on all the pixels P at the same time according to a horizontal synchronous signal HD, and signals are read out of the photoelectric converting layers PA1 and PA2 of all the pixels P and discharged to the power potential VDD. Then, the global reset signal ARSET is falling edge-triggered, and the photoelectric converting layers PA1 and PA2 of all the pixels P start the accumulation operation at the same time.

At a time t1, reset signals RESET12, RESET34, RESET56, and the like of all the pixels P and read signals Read1A, Read2A, Read3A, Read4A, and the like is rising edge-triggered at the same time, and the extra signal charges (a leakage current, a flaw, or the like) remaining in the charge accumulating layers MAA1 and MAA2 are discharged to the reset potential VReset through the reset transistor TB2.

The read signal Read1A is supplied to the charge accumulating layers MAA1 of the pixels P of the first line, the read signal Read2A is supplied to the charge accumulating layers MAA2 of the pixels P of the second line, the read signal Read3A is supplied to the charge accumulating layers MAA1 of the pixels P of the third line, and the read signal Read4A is supplied to the charge accumulating layers MAA2 of the pixels P of the fourth line.

At a time t2, the global read signal AReadA is rising edge-triggered on all the pixels P at the same time, the signal charges photoelectric-converted by the photoelectric converting layers PA11 and PA12 and accumulated are read out to the charge accumulating layers MAA1 and MAA2. At this time, "t2−t0" may be given as an accumulation period of time tacc11.

At a time t3, reset signals RESET12, RESET34, RESET56, and the like of all the pixels P and read signals Read1B, Read2B, Read3B, Read4B, and the like is rising edge-triggered at the same time, and the extra signal charges (a leakage current, a flaw, or the like) remaining in the charge accumulating layers MAB1 and MAB2 are discharged to the reset potential VReset through the reset transistor TB2.

The read signal Read1B is supplied to the charge accumulating layers MAB1 of the pixels P of the first line, the read signal Read2B is supplied to the charge accumulating layers MAB2 of the pixels P of the second line, the read signal Read3B is supplied to the charge accumulating layers MAB1 of the pixels P of the third line, and the read signal Read4B is supplied to the charge accumulating layers MAB2 of the pixels P of the fourth line.

At a time t4, the global read signal AReadB is rising edge-triggered on all the pixels P at the same time, and the signal charges photoelectric-converted by the photoelectric converting layers PA11 and PA12 and accumulated are read out to the charge accumulating layers MAB1 and MAB2. At this time, "t2−t4" may be given as an accumulation period of time tacc12. Further, at this time, the vertical synchronous signal is rising edge-triggered, and a frame is switched from F1 to F2.

At a time t5, the reset signal RESET12 is rising edge-triggered, and the extra signal charges (a leakage current, a flaw, or the like) remaining in the floating diffusions FD of the pixels P of the first line and the second line are discharged to the reset potential VReset through the reset transistor TB2. At this time, the voltage of the reset potential VReset may be set to the same voltage as the power potential VDD.

At a time t6, the read signal Read1A is rising edge-triggered, and the signal charges accumulated in the charge accumulating layer MAA1 of the first line are read out to the floating diffusion FD. The signal charges read out to the floating diffusion FD are converted into a voltage by the detecting transistor TA2 and output as the pixel signal Vsig.

At this time, it is possible to extract only the image signal component by the CDS operation for obtaining the difference between the pixel signal Vsig of the reset level when the reset signal RESET12 is rising edge-triggered and the pixel signal Vsig of the signal level when the read signal Read1 is rising edge-triggered.

At a time t7, the reset signal RESET12 is rising edge-triggered, and the extra signal charges (a leakage current, a flaw, or the like) remaining in the floating diffusions FD of the pixels P of the first line and the second line are discharged to the reset potential VReset through the reset transistor TB2. At this time, the voltage of the reset potential VReset may be set to the same voltage as the power potential VDD.

At a time t8, the read signal Read1B is rising edge-triggered, and the signal charges accumulated in the charge accumulating layer MAB1 of the first line are read out to the floating diffusion FD. The signal charges read out to the floating diffusion FD are converted into a voltage by the detecting transistor TA2 and then output as the pixel signal Vsig of the signal level.

Similarly, at a time t9 to a time t12, the same operation is executed, and the signal charges accumulated in the charge accumulating layers MAA2 and MAB2 of the second line are read out.

At a time t13, the reset signal RESET12 is falling edge-triggered to 0.5 V or less, and the detecting transistor TA2 is turned off. Alternatively, an address transistor may be disposed at the power potential VDD side or the vertical signal line Vlin side of the detecting transistor TA2, and an OFF setting may be performed by turning off the address transistor.

Similarly, an operation during the period of the time from the time t5 to the time t13 is executed in the vertical direction for each line, and the signals accumulated in the charge accumulating layers MAA1, MAB1, MAA2, and MAB2 can be read out on all the pixels P.

In the embodiment illustrated in FIG. 10, during the accumulation period of time Tacc1 of the frame F1, the accumulation operation of the photoelectric converting layers PA11 and PA12 is executed twice (the accumulation period of time tacc11 and the accumulation period of time tacc12). The ratio of the two accumulation period of times tacc11 and tacc12 may be freely set. When the accumulation period of times tacc11 and tacc12 may be equal to each other, the signal which is twice as much as the saturated signal amount of the photoelectric converting layers PA11 and PA12 can be obtained.

Figure 11:
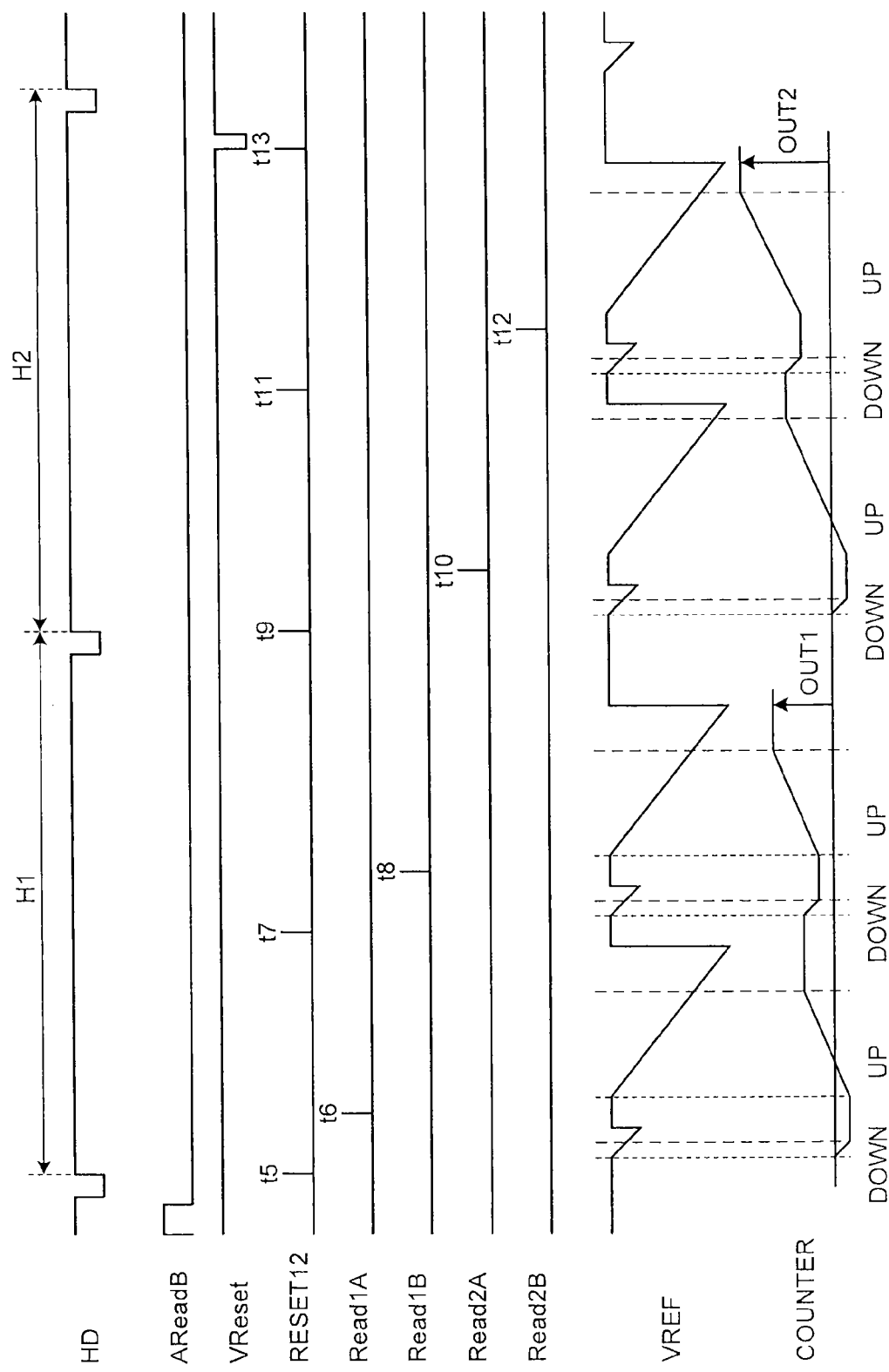
FIG. 11 is an enlarged timing chart illustrating a period of time from a time t5 to a time t13 of FIG. 10.

FIG. 11 is an enlarged timing chart illustrating the period of time from the time t5 to the time t13 of FIG. 10.

Referring to FIG. 11, at the time t5, the reset signal RESET12 is rising edge-triggered, and the extra signal charges (a leakage current, a flaw, or the like) remaining in the floating diffusions FD of the pixels P of the first line and the second line are discharged to the reset potential VReset through the reset transistor TB2. Then, the pixel signal Vsig of the reset level is compared with the reference voltage VREF, and down-counting is performed until the pixel signal Vsig of the reset level matches the reference voltage VREF.

At the time t6, the read signal Read1A is rising edge-triggered, and the signal charges accumulated in the charge accumulating layer MAA1 of the first line are read out to the floating diffusion FD. Then, the pixel signal Vsig of the signal level is compared with the reference voltage VREF, and up-counting is now performed until the pixel signal Vsig of the signal level matches the level of the reference voltage VREF, and thus the difference between the pixel signal Vsig of the signal level and the pixel signal Vsig of the reset level is converted into a digital value of only the image signal component.

At the time t7, the counting result is not reset, and the reset signal RESET12 is rising edge-triggered, and thus the extra signal charges (a leakage current, a flaw, or the like) remaining in the floating diffusions FD of the pixels P of the first line and the second line are discharged to the reset potential VReset through the reset transistor TB2. Then, the pixel signal Vsig of the reset level is compared with the reference voltage VREF, and down-counting is performed until the pixel signal Vsig of the reset level matches the level of the reference voltage VREF.

At the time t8, the read signal Read1B is rising edge-triggered, and the signal charges accumulated in the charge accumulating layer MAB1 of the first line are read out to the floating diffusion FD. Then, the pixel signal Vsig of the signal level is compared with the reference voltage VREF, up-counting is now performed until the pixel signal Vsig of the signal level matches the level of the reference voltage VREF, and thus the difference between the pixel signal Vsig of the signal level and the pixel signal Vsig of the reset level is converted into a digital value and output as the output signal OUT1. The output signal OUT1 is an addition value of the signals of the charge accumulating layers MAA1 and MAB1, and the signal which is twice as much as the saturation amount of the photoelectric converting layer PA11 can be obtained (a horizontal period H1).

During the period of time from the time t9 to the time t12, the same operation as during the period of time from the time t5 to the time t8 is performed on the pixels P of the second line. Thus, an output signal OUT2 can be obtained, and the saturation signal which is twice as much as the photoelectric converting layer PA12 can be achieved (a horizontal period H2).

Figure 12:
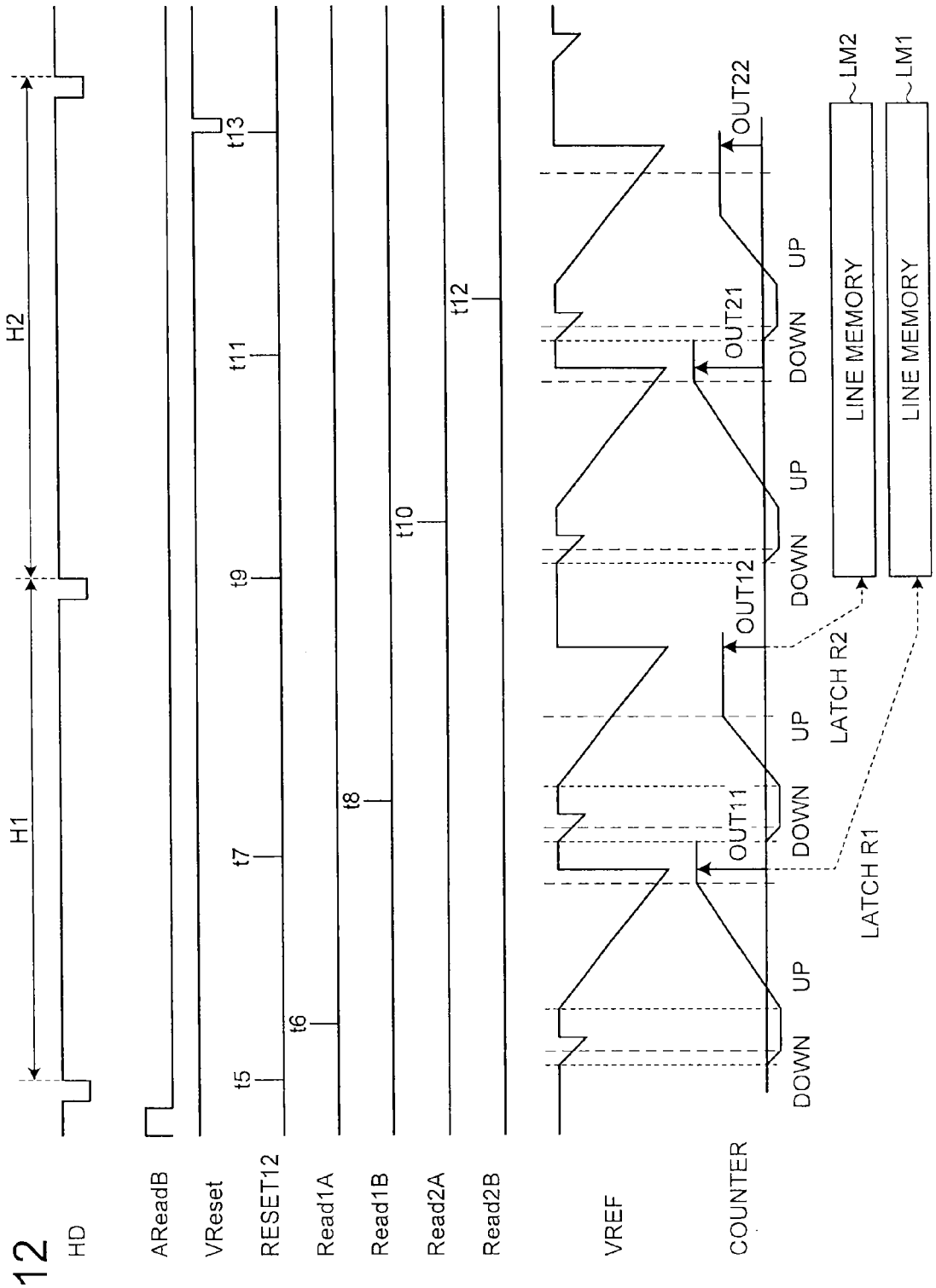
FIG. 12 is an enlarged timing chart illustrating a period of time, which corresponds to a period of time from a time t5 to a time t13 of FIG. 10, in a two-pixel one-cell structure according to a third embodiment.

FIG. 12 is an enlarged timing chart illustrating a period of time, which corresponds to the period of time from the time t5 to the time t13 of FIG. 10, in a two-pixel one-cell structure according to a third embodiment. The embodiment illustrated in FIG. 11 has been described in connection with the method in which the signals of the charge accumulating layers MAA1 and MAB1 are added and output, but an embodiment illustrated in FIG. 12 will be described in connection with a method of separately outputting the signals of the charge accumulating layers MAA1 and MAB1.

Referring to FIG. 12, an output signal OUT11 of the charge accumulating layer MAA1 is held in a latch circuit R1. An output signal OUT12 of the charge accumulating layer MAB1 is held in a latch circuit R2. When the horizontal period H1 switches to the horizontal period H2, the values held in the latch circuits R1 and R2 are input to line memories LM1 and LM2, respectively. Then, the values are sequentially read out at the same time by a next horizontal synchronous signal, and then signal processing for the wide dynamic range is executed.

For example, a digital gain according to a difference in the length of the accumulation period of time may be multiplied so that the two signals can have the same signal amount, and synthesizing may be performed so that the two signals can be linear. A ratio tacc12/tacc11 of the accumulation periods of time may be set to 1/4, 1/8, 1/16, 1/32, or the like. At this time, a linear inclination is obtained by multiplying the signal of the accumulation period of time tacc12 by 4, 8, 16, and 32 as the digital gain. When the signal of the accumulation period of time tacc11 is saturated, switching to the signal obtained by multiplying the signal of the accumulation period of time tacc12 by the gain is performed, and the signal is output. As a result, the signal in which the dynamic range is increased by 4, 8, 16, and 32 times can be obtained.

Figure 13A:
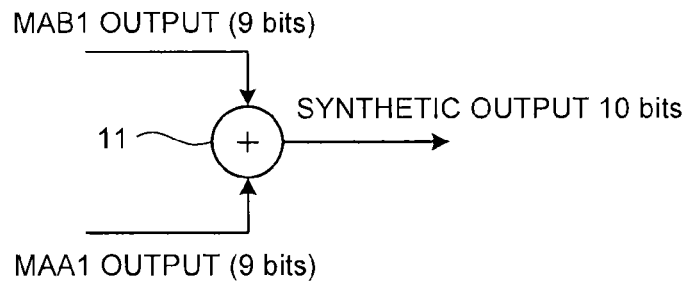
FIG. 13A is a block diagram illustrating a schematic configuration of an output synthesizing unit applied to the two-pixel one-cell structure according to the third embodiment.
Figure 13B:
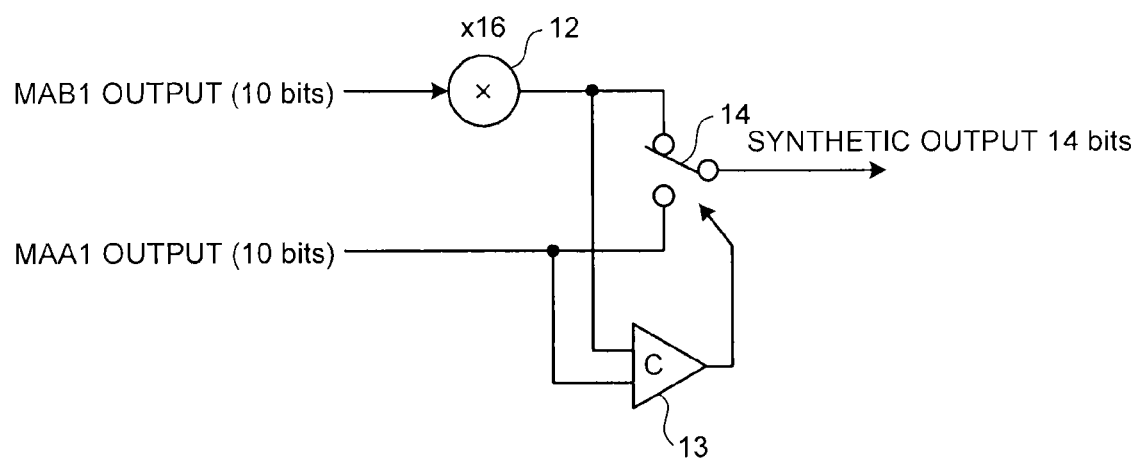
FIG. 13B is a block diagram illustrating a schematic configuration of an output synthesizing unit applied to a two-pixel one-cell structure according to a fourth embodiment.

FIG. 13A is a block diagram illustrating a schematic configuration of an output synthesizing unit applied to the two-pixel one-cell structure according to the third embodiment, and FIG. 13B is a block diagram illustrating a schematic configuration of an output synthesizing unit applied to a two-pixel one-cell structure according to a fourth embodiment.

Referring to FIG. 13A, the signals from the charge accumulating layers MAA1 and MAB1 may be not added by a counter but stored in the individual line memories as illustrated in FIG. 12, and then a twofold saturation signal may be obtained by adding the signals read from the line memories through a digital adding circuit 11.

Referring to FIG. 13B, for example, when the ratio of the accumulation periods of time tacc11 and tacc12 is set to 16:1, the output signal of the charge accumulating layer MAB1 is multiplied by 16 by a multiplier 12, and then the signal obtained by multiplying the output signal of the charge accumulating layer MAB1 by 16 is compared with the output signal of the charge accumulating layer MAA1 through a comparing circuit 13. At this time, before the output of the charge accumulating layer MAA1 is saturated, a threshold value may be set so that the output of the charge accumulating layer MAA1 can be set. When the output of the charge accumulating layer MAA1 has a level of the set threshold value or more, the output of the charge accumulating layer MAA1 is compared to the signal obtained by multiplying the output of the charge accumulating layer MAB1 by 16. When the signal obtained by multiplying the output of the charge accumulating layer MAB1 by 16 is larger than the output of the charge accumulating layer MAA1, the signal obtained by multiplying the output of the charge accumulating layer MAB1 by 16 is selected by a switch 14, and thus a 14-bit enlarged signal having a linear dynamic range can be obtained.

Figure 14:
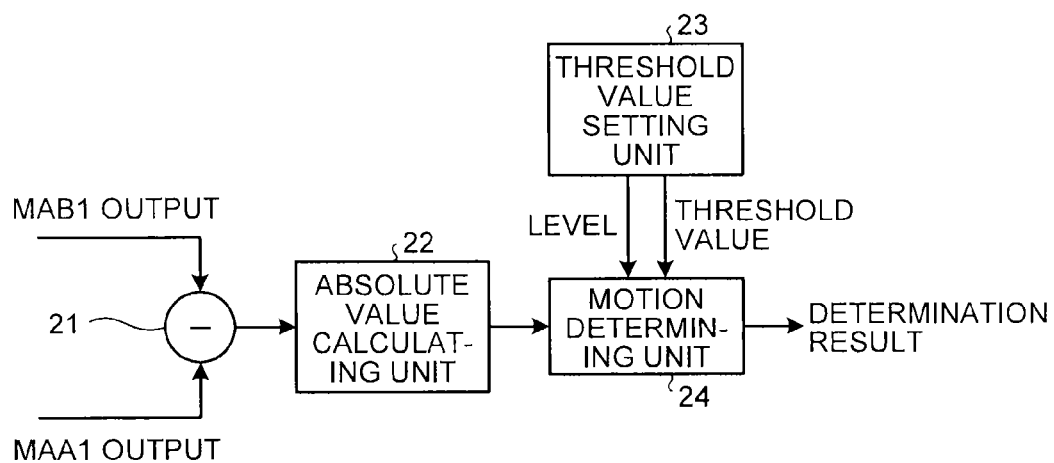
FIG. 14 is a block diagram illustrating a schematic configuration of a motion detecting unit applied to a two-pixel one-cell structure according to a fifth embodiment.

FIG. 14 is a block diagram illustrating a schematic configuration of a motion detecting unit applied to a two-pixel one-cell structure according to a fifth embodiment.

Referring to FIG. 14, in a motion detecting mode, it is determined whether or not a moving object is included in the subject based on a difference between two signals that differ from each other in a shooting time.

For example, when the accumulation periods of time tacc11 and tacc12 are equal to each other, it is possible to extract only an edge signal of a moved subject by calculating a difference between the signals from the charge accumulating layers MAA1 and MAB1 through a subtractor 21. An absolute value of the difference between the signals is calculated by an absolute value calculating unit 22, and then input to a motion determining unit 24. The motion determining unit 24 counts the number of signals larger than a level set by a threshold value setting unit 23, and when the counted number is larger than the set threshold value, it can be determined that there is a moved subject.

Figure 15:
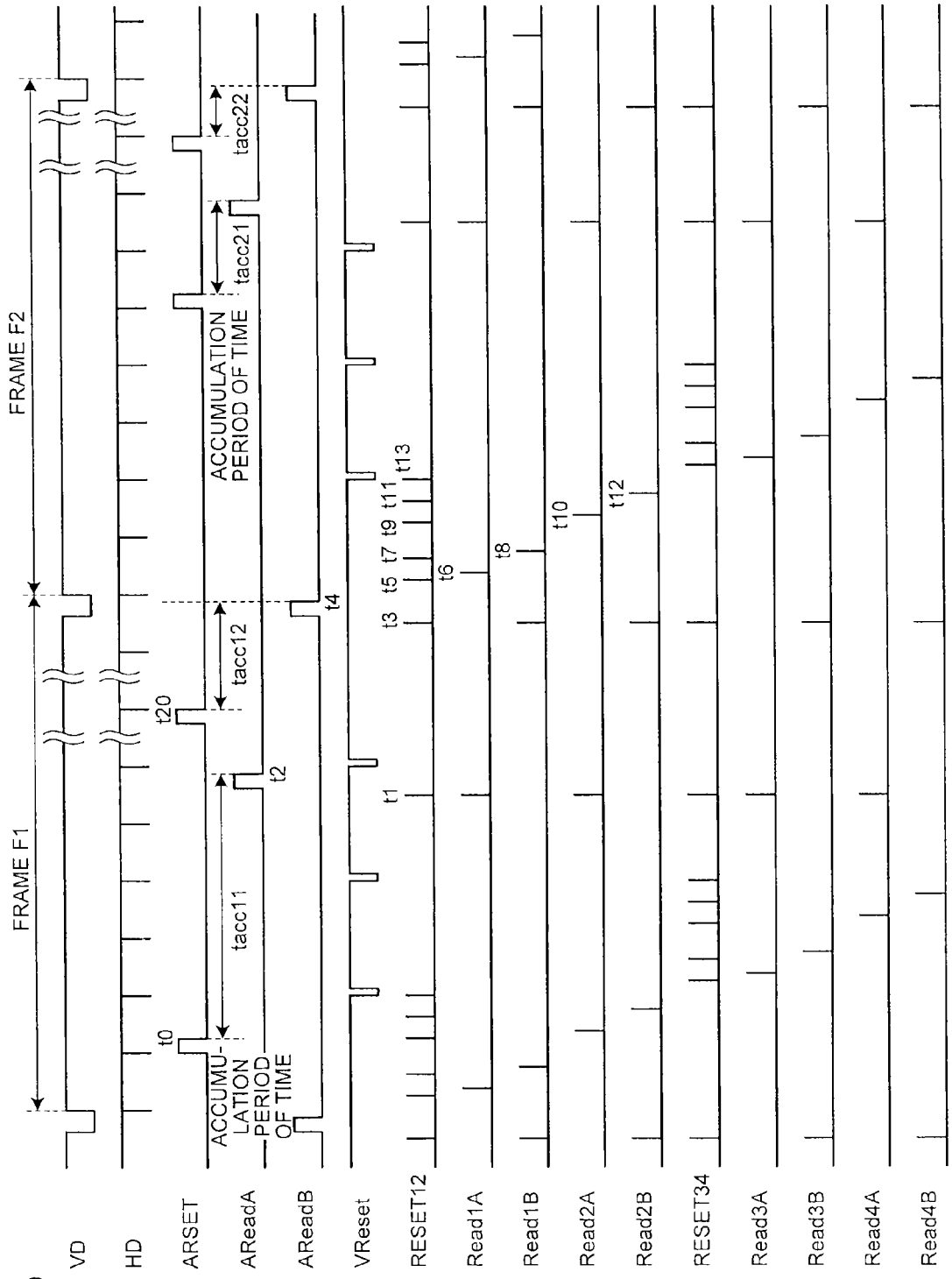
FIG. 15 is a timing chart illustrating an operation of components of a two-pixel one-cell structure according to a sixth embodiment.

FIG. 15 is a timing chart illustrating an operation of components of a two-pixel one-cell structure according to a sixth embodiment.

Referring to FIG. 15, at a time t20, a pulse is added to the global reset signal ARSET of FIG. 10. As a result, a time difference can be set between the accumulation period of time tacc11 and the accumulation period of time tacc12, and the accuracy of motion detection can be improved. Particularly, for a slowly moving subject, a lengthy time difference may be set between the accumulation period of time tacc11 and the accumulation period of time tacc12, and the detection capability can be improved.

Figure 16:
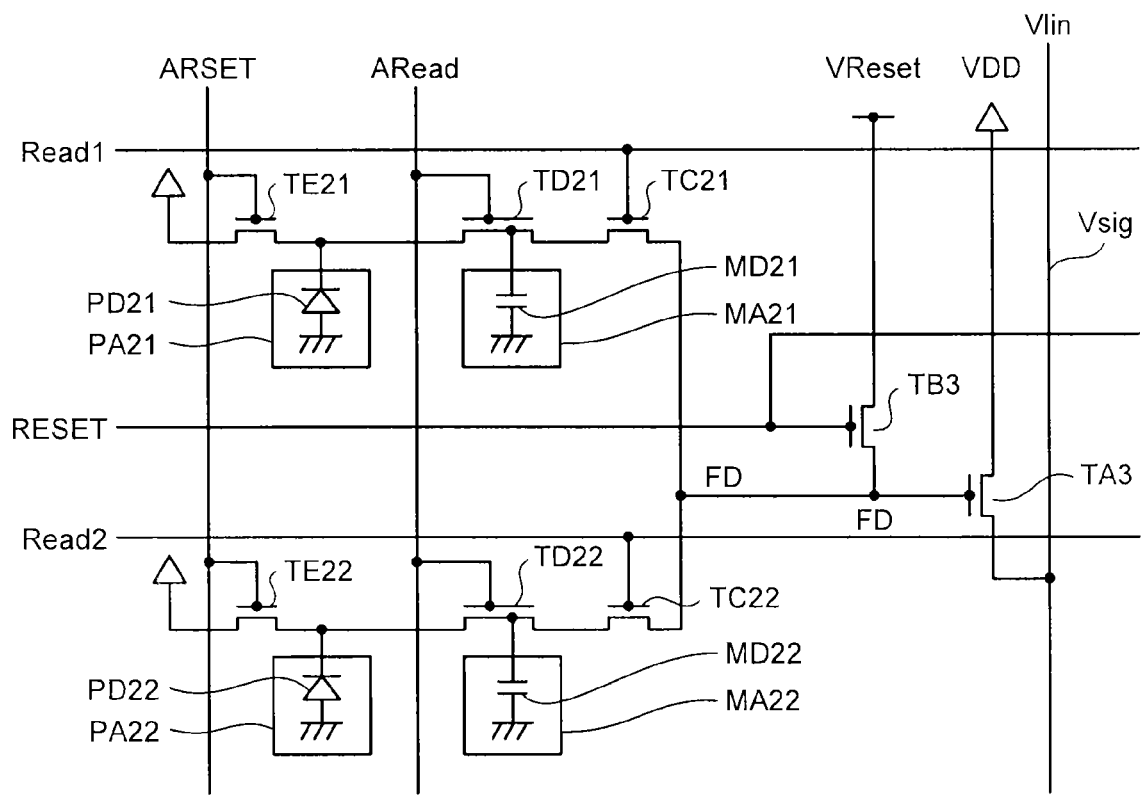
FIG. 16 is a circuit diagram illustrating a schematic configuration of a two-pixel one-cell structure according to a seventh embodiment.

FIG. 16 is a circuit diagram illustrating a schematic configuration of a two-pixel one-cell structure according to a seventh embodiment.

Referring to FIG. 16, a cell includes photoelectric converting layers PA21 and PA22, charge accumulating layers MA21 and MA22, a detecting transistor TA3, a reset transistor TB3, read transistors TC21 and TC22, global reset transistors TE21 and TE22, and global read gates TD21 and TD22. A floating diffusion FD is formed at a connection point among the detecting transistor TA3, the reset transistor TB3, and the read transistors TC21 and TC22 as a detection node. Here, the photodiodes PD21 and PD22 are formed in the photoelectric converting layers PA21 and PA22, respectively, and the charge coupling layers MD21 and MD22 are formed in the charge accumulating layers MA21 and MA22, respectively.

Here, the photoelectric converting layer PA21, the charge accumulating layer MA21, the read transistor TC21, the global reset transistor TE21, and the global read gate TD21 may belong to one pixel P of the cell, and the photoelectric converting layer PA22, the charge accumulating layer MA22, the read transistor TC22, the global reset transistor T522, and the global read gate TD22 may belong to the other pixel P of the cell. The floating diffusion FD, the detecting transistor TA3, and the reset transistor TB3 are shared by the two pixels P of the cell.

The global reset transistor TE21, the global read gate TD21, and the read transistor TC21 are connected in series. The photodiode PD21 is connected to a connection point between the global reset transistor TE21 and the global read gate TD21, and the charge coupling layer MD21 is coupled to the global read gate TD21.

The global reset transistor TE22, the global read gate TD22, and the read transistor TC22 are connected in series. The photodiode PD22 is connected to a connection point between the global reset transistor TE22 and the global read gate TD22, and the charge coupling layer MD22 is coupled to the global read gate TD22.

Source of the read transistors TC21 and TC22, a gate of the detecting transistor TA3, and a source of the reset transistor TB3 are connected to the floating diffusion FD.

The global reset signal ARSET is input to gates of the global reset transistors TE21 and TE22, and the global read signal ARead is input to the global read gates TD21 and TD22. The read signals Read1 and Read2 are input to gates of the read transistors TC21 and TC22, respectively, and the reset signal RESET is input to a gate of the reset transistor TB3. The reset potential VReset is input to a drain of the reset transistor TB3, the power potential VDD is input to a drain of the detecting transistor TA3, and the pixel signal Vsig is output from a source of the detecting transistor TA31 to the vertical signal line Vlin.

Here, the charge accumulating layers MA21 and MA22 are formed for every photoelectric converting layers PA21 and PA22, the charge accumulation operations of the photoelectric converting layers PA21 and PA22 of all the pixels P are simultaneously started, and charges are simultaneously read out from the photoelectric converting layers PA21 and PA22 of all the pixels P to the charge accumulating layers MA21 and MA22. Thus, even while the subject is being moved, rolling shutter distortion in which the subject is obliquely imaged can be avoided.

Figure 17:
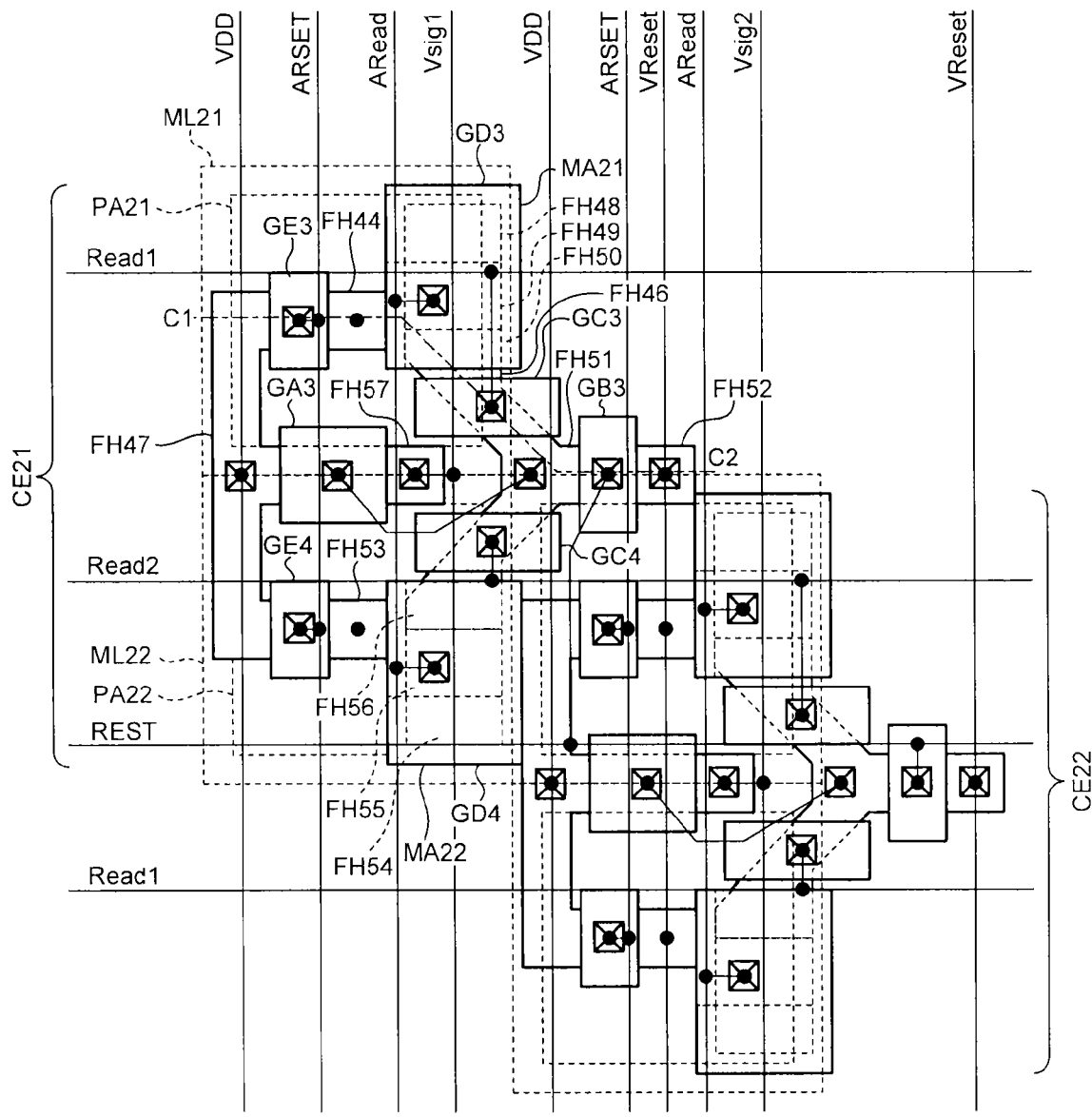
FIG. 17 is a plane view illustrating of the layout structure of the two-pixel one-cell structure of FIG. 16.

FIG. 17 is a plane view illustrating the layout structure of the two-pixel one-cell structure of FIG. 16.

Referring to FIG. 17, a cell CE21 includes the photoelectric converting layers PA21 and PA22 and the charge accumulating layers MA21 and MA22. Here, the photoelectric converting layers PA21 and PA22 may be disposed on the back surface side of the semiconductor substrate, and the charge accumulating layers MA21 and MA22 may be disposed on the front surface side of the semiconductor substrate. The photoelectric converting layers PA21 and PA22 may at least partially overlap the charge accumulating layers MA21 and MA22. Microlenses ML21 and ML22 are disposed on the photoelectric converting layers PA21 and PA22, respectively. The microlenses ML21 and ML22 may make light incident to the back surface side of the semiconductor substrate to be collected on the photoelectric converting layers PA21 and PA22 not to be incident to the charge accumulating layers MA21 and MA22.

Further, the cell CE21 includes gate electrodes GA3, GB3, GC3, GC4, GD3, GD4, GE3, and GE4. The gate electrodes GA3, GB3, GC3, GC4, GD3, GD4, GE3, and GE4 may be disposed on the front surface side of the semiconductor substrate. The gate electrode GA3 may configure the detecting transistor TA3, the gate electrode GB3 may configure the reset transistor TB3, the gate electrodes GC3 and GC4 may configure the read transistors TC21 and TC22, respectively, the gate electrodes GD3 and GD4 may configure the global read gates TD21 and TD22, respectively, and the gate electrodes GE3 and GE4 may configure the global reset transistors TE21 and TE22, respectively.

The impurity diffusion layer FH47 is formed between the gate electrodes GE3 and GE4 and the gate electrode GA3, the impurity diffusion layer FH44 is formed between the gate electrode GE3 and the gate electrode GD3, the impurity diffusion layer FH46 is formed between the gate electrode GD3 and the gate electrode GC3, the impurity diffusion layer FH51 is formed between the gate electrodes GC3 and GC4 and the gate electrode GB3, the impurity diffusion layer FH53 is formed between the gate electrode GE4 and the gate electrode GD4, and the impurity diffusion layer FH46 is formed between the gate electrode GD4 and the gate electrode GC4. An impurity diffusion layer FH57 is formed at the side opposite to the impurity diffusion layer FH47 with the gate electrode GA3 interposed therebetween, and an impurity diffusion layer FH52 is formed at the side opposite to the impurity diffusion layer FH51 with the gate electrode GB3 interposed therebetween. Impurity diffusion layers FH48, FH49, and FH50 are formed below the gate electrode GD3, and impurity diffusion layers FH54, FH55, and FH56 are formed below the gate electrode GD4.

Here, the photoelectric converting layers PA21 and PA22 may be arranged to be symmetric to each other in the column direction CD centering on the detecting transistor TA3, and the charge accumulating layers MA21 and MA22 may be arranged to be symmetric to each other in the column direction CD centering on the detecting transistor TA3. The read transistors TC21 and TC22, the global read gates TD21 and TD22, and the global reset transistors TE21 and TE22 may be arranged to be symmetric to one another in the column direction CD centering on the detecting transistor TA3, respectively. The detecting transistor TA3 may be arranged to be surrounded by the read transistors TC21 and TC22, the global read gates TD21 and TD22, and the global reset transistors TE21 and TE22. The cells CE21 and CE22 may be arranged to be adjacent to each other in a direction inclined to the column direction CD at 45°.

An interconnection used to transfer the global reset signal ARSET is connected to the gate electrodes GE3 and GE4, an interconnection used to transfer the global read signal ARead is connected to the gate electrodes GD3 and GD4, an interconnection used to transfer the reset potential VReset is connected to the impurity diffusion layer FH52, an interconnection used to transfer the power potential VDD is connected to the impurity diffusion layer FH47, an interconnection used to transfer the pixel signal Vsig1 is connected to the impurity diffusion layer FH57, an interconnection used to transfer the read signal Read1 is connected to the gate electrode GC3, an interconnection used to transfer the read signal Read2 is connected to the gate electrode GC4, and an interconnection used to transfer the reset signal RESET is connected to the gate electrode GB3. The gate electrode GA3 is connected to the impurity diffusion layer FH51.

Here, since the cells CE21 and CE22 are arranged to be adjacent to each other in a direction inclined to the column direction CD at 45°, the interconnection used to transfer the read signals Read1 and Read2 and the interconnection used to transfer the reset signal RESET can be shared between the cells CE21 and CE22. Thus, the interconnection used to transfer the read signals Read1 and Read2 and the interconnection used to transfer the reset signal RESET need not be separately disposed in the cells CE21 and CE22, and thus the number of interconnections can be reduced.

Figure 18:
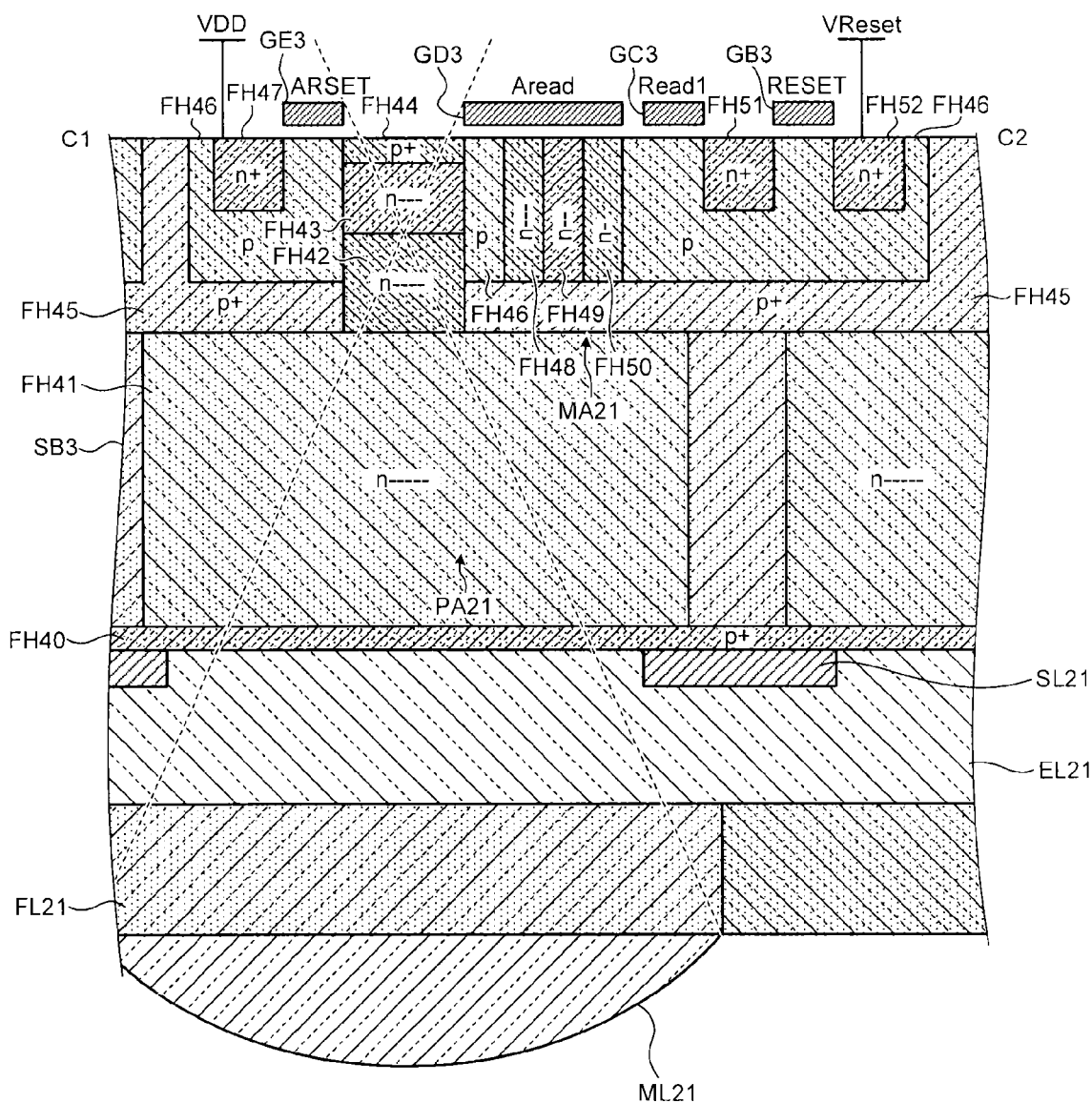
FIG. 18 is a cross-sectional view taken along line C1-C2 of FIG. 17.

FIG. 18 is a cross-sectional view taken along line C1-C2 of FIG. 17.

Referring to FIG. 18, an impurity diffusion layer FH41 is formed at the back surface side of a semiconductor substrate SB3, and an impurity diffusion layer FH40 is formed on the uppermost layer of the back surface side of the semiconductor substrate SB3. A P well FH45 is formed on the front surface side of the semiconductor substrate SB3, and a P well FH46 is formed in the P well FH45. The P well FH45 may be formed to be higher in impurity concentration than the P well FH46. The gate electrodes GB3, GC3, GD3, and GE3 are formed above the P well FH46. In the P well FH46, the impurity diffusion layer FH44 is formed between the gate electrodes GE3 and GD3, the impurity diffusion layers FH46, FH48, FH49, and FHS0 are formed below the gate electrode GD1, and the impurity diffusion layer FH51 is formed between the gate electrodes GC3 and GB3. Further, in the P well FH46, the impurity diffusion layer FH46 is formed at the side opposite to the impurity diffusion layer FH44 with the gate electrode GE3 interposed therebetween, and the impurity diffusion layer FH52 is formed at the side opposite to the impurity diffusion layer FH51 with the gate electrode GB3 interposed therebetween. The impurity diffusion layers FH43 and FH42 are sequentially formed in the depth direction between the Impurity diffusion layers FH44 and FH41. The impurity diffusion layers FH41, FH42, FH43, FH47, FH48, FH49, FHS0, FH51, and FH52 may have an n type, and the impurity diffusion layers FH40 and FH44 may have a p type. The impurity diffusion layers FH41, FH42, and FH43 are formed to increase in the impurity concentration in the described order. The impurity diffusion layers FH48, FH49, and FHS0 are formed to increase in the impurity concentration in the described order. The photoelectric converting layer PA21 may be arranged to at least partially overlap the charge accumulating layer MA21. The photoelectric converting layer PA21 may be separated from the charge accumulating layer MA21 by the P well FH45.

On the back surface side of the semiconductor substrate SB3, a transparent layer EL21 is formed on the impurity diffusion layer FH40, and a microlens ML21 is formed over the transparent layer EL21 with a color filter FL21 interposed therebetween. A light blocking layer SL21 is buried in the transparent layer EL21. The microlens ML21 may make light incident to the back surface side of the semiconductor substrate SB3 to be collected on the photoelectric converting layer PA21 not to be incident to the charge accumulating layer MA21. The light blocking layer SL21 can block light incident to the back surface side of the semiconductor substrate SB3 from being incident to the charge accumulating layer MA21. The transparent layer EL21 increases an interval between the photoelectric converting layer PA21 and the microlens ML21, and thus an incident angle of light incident to the photoelectric converting layer PA21 can be reduced.

Here, as the photoelectric converting layer PA21 is arranged to at least partially overlap the charge accumulating layer MA21, the size of the pixel P can be reduced while supporting the global shutter structure. Further, as the light blocking layer SL21 is formed at the back surface side of the semiconductor substrate SB3, light incident to the back surface side of the semiconductor substrate SB3 can be prevented from being incident to the charge accumulating layer MA21. Furthermore, as the transparent layer EL21 is formed at the back surface side of the semiconductor substrate SB3, an incident angle of light incident to the photoelectric converting layer PA21 can be reduced, and light to be collected on the photoelectric converting layer PA21 can be prevented from leaking to the charge accumulating layer MA21. In addition, as the impurity diffusion layer FH40 is formed on the uppermost layer of the back surface side of the semiconductor substrate SB3, a leakage current leaking to the charge accumulating layer MA21 can be reduced.

Further, as the P well in the front surface side of the semiconductor substrate SB3 has a dual-layer structure, and the P well FH45 separating the photoelectric converting layer PA21 from the charge accumulating layer MA21 is higher in the impurity concentration than the P well FH46 in which a channel is formed, isolation between the photoelectric converting layer PA21 and the charge accumulating layer MA21 can be improved. Further, as the P well FH45 is formed, the capacity of the photoelectric converting layer PA21 and the charge accumulating layer MA21 can be increased, the number of saturated electrons can be increased, and charges generated in the boundary between the photoelectric converting layer PA21 and the charge accumulating layer MA21 can be easily taken into the photoelectric converting layer PA21.

Figure 19:
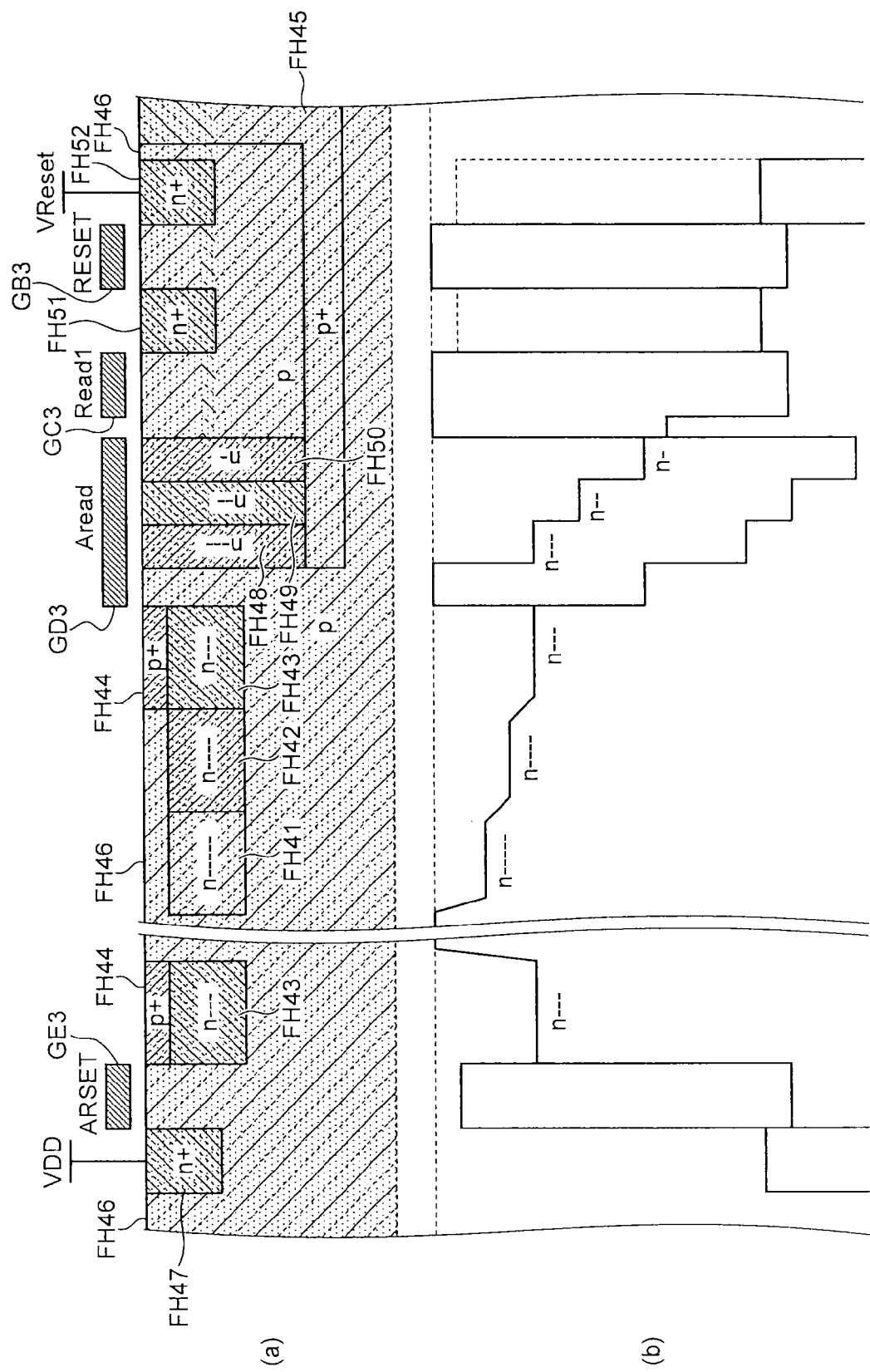
FIG. 19A is a cross-sectional view illustrating a configuration in which an impurity diffusion layer of a photoelectric converting layer of FIG. 18 is developed in a horizontal direction.
FIG. 19B is a diagram illustrating the potential distribution of the configuration illustrated in FIG. 19A.

FIG. 19A is a cross-sectional view illustrating a configuration in which the impurity diffusion layer of the photoelectric converting layer of FIG. 18 is developed in the horizontal direction, and FIG. 19B is a diagram illustrating the potential distribution of the configuration illustrated in FIG. 19A.

Referring to FIG. 19A, the impurity diffusion layers FH41, FH42, and FH43 are set to increase in the impurity concentration in the described order, and the potential gradient is formed from the back surface side of the semiconductor substrate SB3 toward the front surface side thereof. Thus, charges generated at the back surface side of the photoelectric converting layer PA21 can be collected at the front surface side thereof, and charges can be smoothly transferred from the photoelectric converting layer PA21 to the charge accumulating layer MA21.

Figure 20:
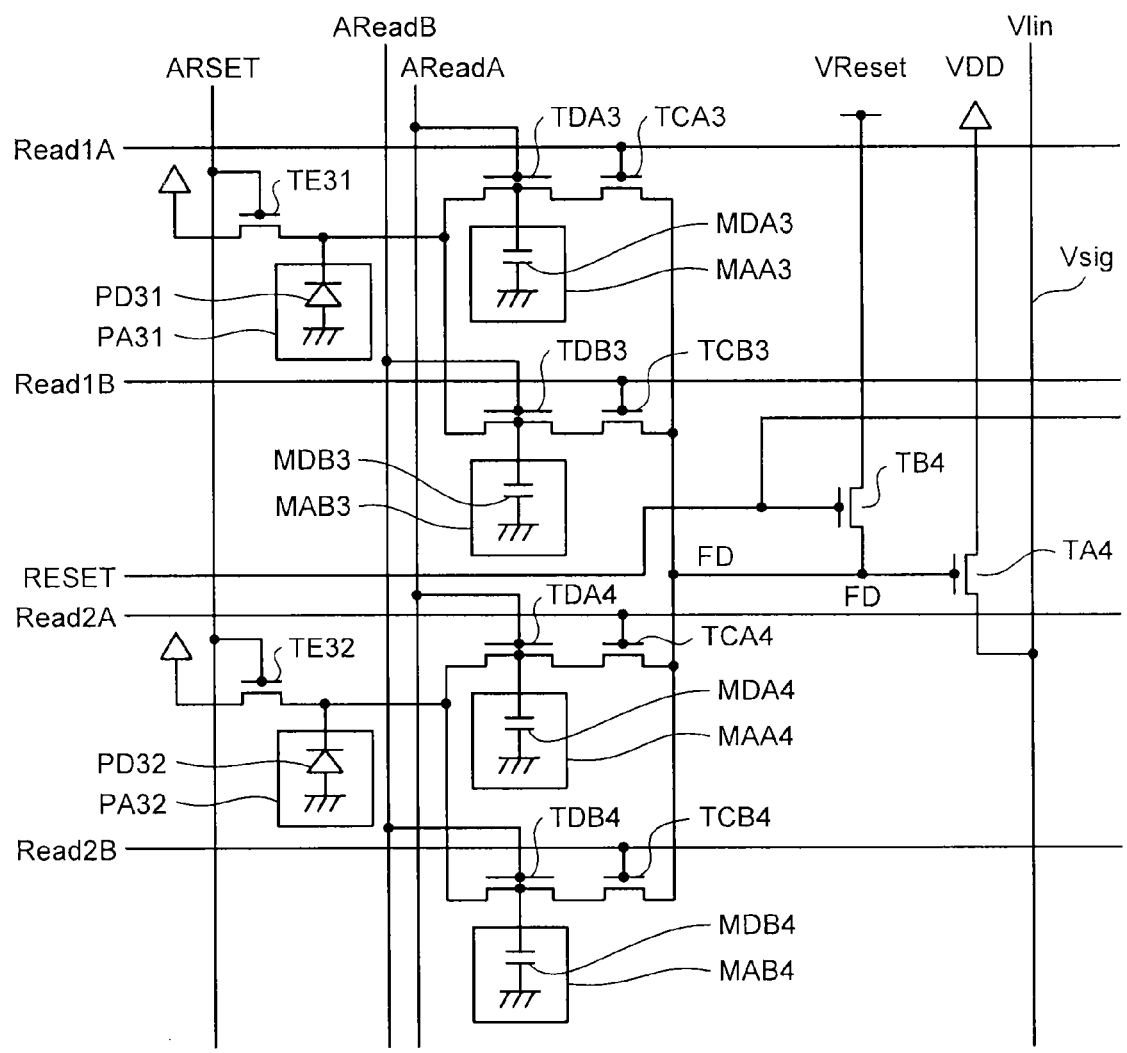
FIG. 20 is a circuit diagram illustrating a schematic configuration of a two-pixel one-cell structure according to an eighth embodiment.

FIG. 20 is a circuit diagram illustrating a schematic configuration of a two-pixel one-cell structure according to an eighth embodiment.

Referring to FIG. 20, a cell includes photoelectric converting layers PA31 and PA32, charge accumulating layers MAA3, MAB3, MAA4, and MAB4, a detecting transistor TA4, a reset transistor TB4, read transistors TCA3, TCB3, TCA4, and TCB4, global reset transistors TE31 and TE32, and global read gates TDA3, TDB3, TDA4, and TDB4. A floating diffusion FD is formed at a connection point among the detecting transistor TA4, the reset transistor TB4, and the read transistors TCA3, TCB3, TCA4, and TCB4 as a detection node. Here, the photodiodes PD31 and PD32 are formed in the photoelectric converting layers PA31 and PA32, respectively, and the charge coupling layers MDA3, MDB3, MDA4, and MDB4 are formed in the charge accumulating layers MAA3, MAB3, MAA4, and MAB4, respectively.

Here, the photoelectric converting layer PA31, the charge accumulating layers MAA3 and MAB3, the read transistors TCA3 and TCB3, the global reset transistor TE31, and the global read gates TDA3 and TDB3 may belong to one pixel P of the cell, and the photoelectric converting layer PA32, the charge accumulating layers MAA4 and MAB4, the read transistors TCA4 and TCB4, the global reset transistor TE32, and the global read gates TDA4 and TDB4 may belong to the other pixel P of the cell. The floating diffusion FD, the detecting transistor TA4, and the reset transistor TB4 are shared by the two pixels P of the cell.

The global read gate TDA3 and the read transistor TCA3 are connected in series, the global read gate TDB3 and the read transistor TCB3 are connected in series, and the series circuits are connected to the global reset transistor TE31 in parallel. The photodiode PD31 is connected to a connection point among the global reset transistor TE31 and the global read gates TDA3 and TDB3, and the charge coupling layers MDA3 and MDB3 are coupled to the global read gates TDA3 and TDB3, respectively.

The global read gate TDA4 and the read transistor TCA4 are connected in series, the global read gate TDB4 and the read transistor TCB4 are connected in series, and the series circuits are connected to the global reset transistor TE41 in parallel. The photodiode PD32 is connected to a connection point among the global reset transistor TE32 and the global read gates TDA4 and TDB4, and the charge coupling layers MDA4 and MDB4 are coupled to the global read gates TDA4 and TDB4, respectively.

Sources of the read transistors TCA3, TCB3, TCA4, and TCB4, and a gate of the detecting transistor TA4, and a source of the reset transistor TB4 are connected to the floating diffusion FD.

The global reset signal ARSET is input to gates of the global reset transistors TE31 and TE32, the global read signal AReadA is input to the global read gates TDA3 and TDA4, and the global read signal AReadB is input to the global read gates TDB3 and TDB4. The read signals Read1A, Read1B, Read2A, and Read2B are input to gates of the read transistors TCA3, TCB3, TCA4, and TCB4, respectively, and the reset signal RESET is input to a gate of the reset transistor TB4. The reset potential VReset is input to a drain of the reset transistor TB4, the power potential VDD is input to a drain of the detecting transistor TA4, and the pixel signal Vsig is output from a source of the detecting transistor TA4 to the vertical signal line Vlin.

Figure 21:
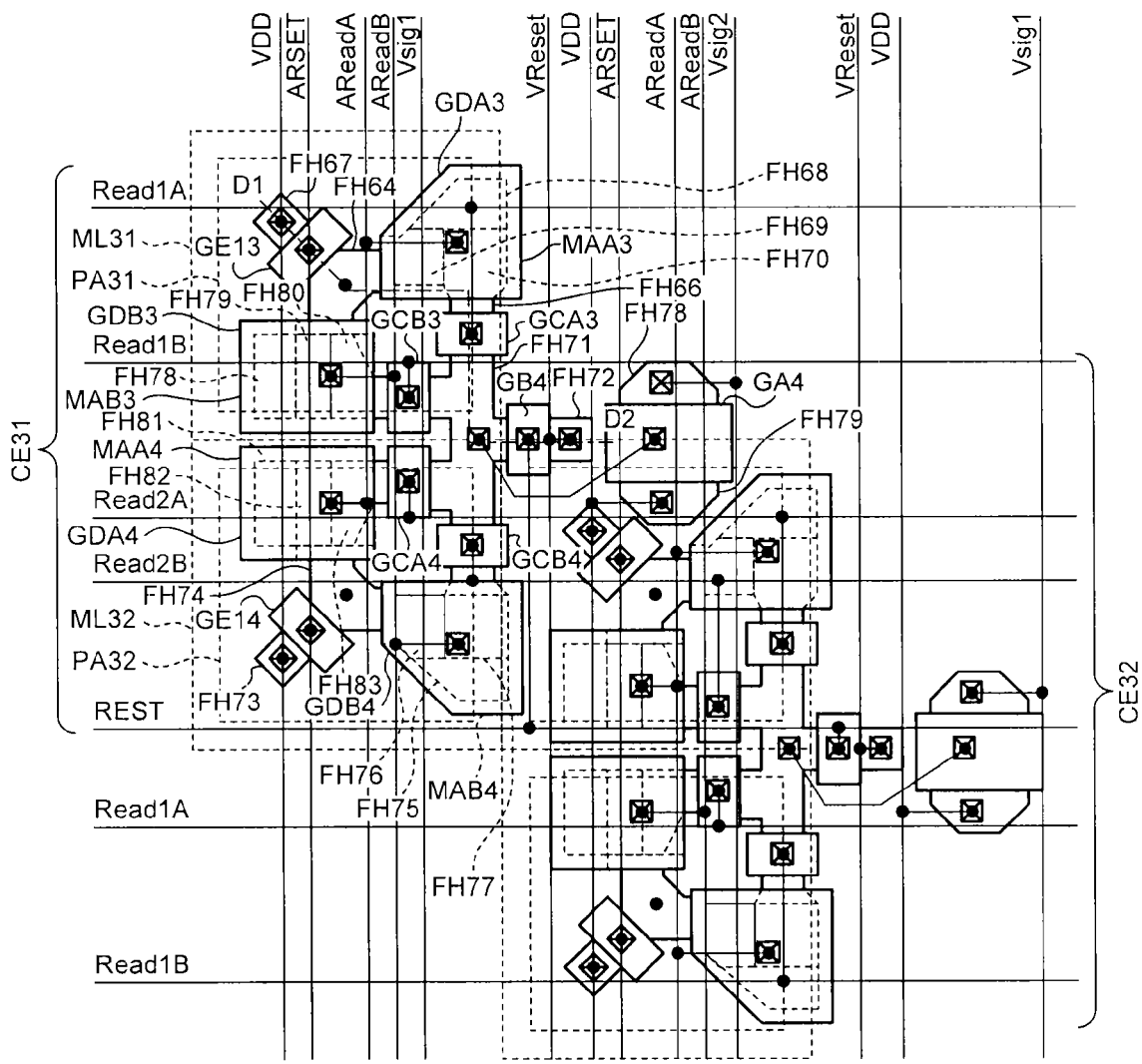
FIG. 21 is a plane view illustrating the layout structure of the two-pixel one-cell structure of FIG. 20.

FIG. 21 is a plane view illustrating the layout structure of the two-pixel one-cell structure of FIG. 20.

Referring to FIG. 21, a cell CE31 includes the photoelectric converting layers PA31 and PA32, and the charge accumulating layers MAA3, MAB3, MAA4, and MAB4. Here, the photoelectric converting layers PA31 and PA32 may be disposed on the back surface side of the semiconductor substrate, and the charge accumulating layers MAA3, MAB3, MAA4, and MAB4 may be disposed on the front surface side of the semiconductor substrate. The photoelectric converting layers PA31 and PA32 may at least partially overlap the charge accumulating layers MAA3, MAB3, MAA4, and MAB4. Microlenses ML31 and ML32 are disposed on the photoelectric converting layers PA31 and PA32, respectively. The microlenses ML31 and ML32 may make light incident to the back surface side of the semiconductor substrate to be collected on the photoelectric converting layers PA31 and PA32 not to be incident to the charge accumulating layers MAA3, MAB3, MAA4, and MAB4.

Further, the cell CE31 includes gate electrodes GA4, GB4, GCA3, GCB3, GCA4, GCB4, GDA3, GDA4, GDB3, GDB4, GE13, and GE14. The gate electrodes GA4, GB4, GCA3, GCB3, GCA4, GCB4, GDA3, GDA4, GDB3, GDB4, GE13, and GE14 may be disposed on the front surface side of the semiconductor substrate. The gate electrode GA4 may configure the detecting transistor TA4, the gate electrode GB4 may configure the reset transistor TB4, the gate electrodes GCA3, GCB3, GCA4, and GCB4 may configure the read transistors TCA3, TCB3, TCA4, and TCB4, respectively, the gate electrodes GDA3, GDB3, GDA4, and GDB4 may configure the global read gates TDA3, TDB3, TDA4, and TDB4, respectively, and the gate electrodes GE13 and GE14 may configure the global reset transistors TE13 and TE14, respectively.

An impurity diffusion layer FH64 is formed between the gate electrode GE13 and the gate electrodes GDA3 and GDB4, an impurity diffusion layer FH66 is formed between the gate electrode GDA3 and the gate electrode GCA3, an impurity diffusion layer FH66 is formed between the gate electrode GDB3 and the gate electrode GCB3, an impurity diffusion layer FH74 is formed between the gate electrode GE14 and the gate electrodes GDA4 and GDB4, an impurity diffusion layer FH66 is formed between the gate electrode GDA4 and the gate electrode GCA4, an impurity diffusion layer FH66 is formed between the gate electrode GDB4 and the gate electrode GCB4, and an impurity diffusion layer FH71 is formed between the gate electrodes GCA3, GCB3, GCA4, and GCB4 and the gate electrode GB4. An impurity diffusion layer FH67 is formed at the side opposite to the impurity diffusion layer FH64 with the gate electrode GE13 interposed therebetween, an impurity diffusion layer FH73 is formed at the side opposite to the impurity diffusion layer FH74 with the gate electrode GE14 interposed therebetween, and an impurity diffusion layer FH72 is formed at the side opposite to the impurity diffusion layer FH71 with the gate electrode GB4 interposed therebetween. Impurity diffusion layers FH78 and FH79 are formed at both sides of the gate electrode GA4. The impurity diffusion layers FH68, FH69, and FH70 are formed below the gate electrode GDA3, the impurity diffusion layers FH78, FH79, and FH80 are formed below the gate electrode GDB3, the impurity diffusion layers FH81, FH82, and FH83 are formed below the gate electrode GDA4, and the impurity diffusion layers FH75, FH76, and FH77 are formed below the gate electrode GDB4.

Here, the photoelectric converting layers PA31 and PA32 may be arranged to be symmetrical to each other in the column direction CD centering on the detecting transistor TA4, and the charge accumulating layers MAA3 and MAB3 and the charge accumulating layers MAA4 and MAB4 may be arranged to be symmetrical to each other in the column direction CD centering on the detecting transistor TA4. The read transistors TCA3, TCB3, TCA4, and TCB4, the global read gates TDA3, TDB3, TDA4, and TDB4, and the global reset transistors TE41 and TE42 may be arranged to be symmetrical to each other in the column direction CD centering on the detecting transistor TA4, respectively. The gate electrodes GCA3, GCB3, GDA3, and GDB3 may be arranged on sides of a rectangle, respectively, and the gate electrodes GB4 and GE13 may be arranged at facing diagonal positions of a rectangle, respectively. The gate electrodes GCA4, GCB4, GDA4, and GDB4 may be arranged on sides of a rectangle, respectively, and the gate electrodes GB4 and GE14 may be arranged at facing diagonal positions of a rectangle, respectively. The cells CE31 and CE32 may be arranged to be adjacent to each other in a direction inclined to the column direction CD at 45°.

An interconnection used to transfer the global reset signal ARSET is connected to the gate electrodes GE13 and GE14, an interconnection used to transfer the global read signal AReadA is connected to the gate electrodes GDA3 and GDA4, an interconnection used to transfer the global read signal AReadB is connected to the gate electrodes GDB3 and GDB4, an interconnection used to transfer the reset potential VReset is connected to the impurity diffusion layer FH72, an interconnection used to transfer the power potential VDD is connected to the impurity diffusion layers FH67 and FH73, an interconnection used to transfer the pixel signal Vsig2 is connected to the impurity diffusion layer FH78, an interconnection used to transfer the read signal Read1A is connected to the gate electrode GCA3, an interconnection used to transfer the read signal Read1B is connected to the gate electrode GCB3, an interconnection used to transfer the read signal Read2A is connected to the gate electrode GCA4, an interconnection used to transfer the read signal Read2B is connected to the gate electrode GCB4, and an interconnection used to transfer the reset signal RESET is connected to the gate electrode GB2. The gate electrode GA24 is connected to the impurity diffusion layer FH71.

Here, since the cells CE31 and CE32 are arranged to be adjacent to each other in a direction inclined to the column direction CD at 45°, the interconnection used to transfer the read signals Read1A, Read1B, Read2A, and Read2B and the interconnection used to transfer the reset signal RESET can be shared between the cells CE31 and CE32. Thus, the interconnection used to transfer the read signals Read1A, Read1B, Read2A, and Read2B and the interconnection used to transfer the reset signal RESET need not be separately disposed in the cells CE31 and CE32, and thus the number of interconnections can be reduced.

Figure 22:
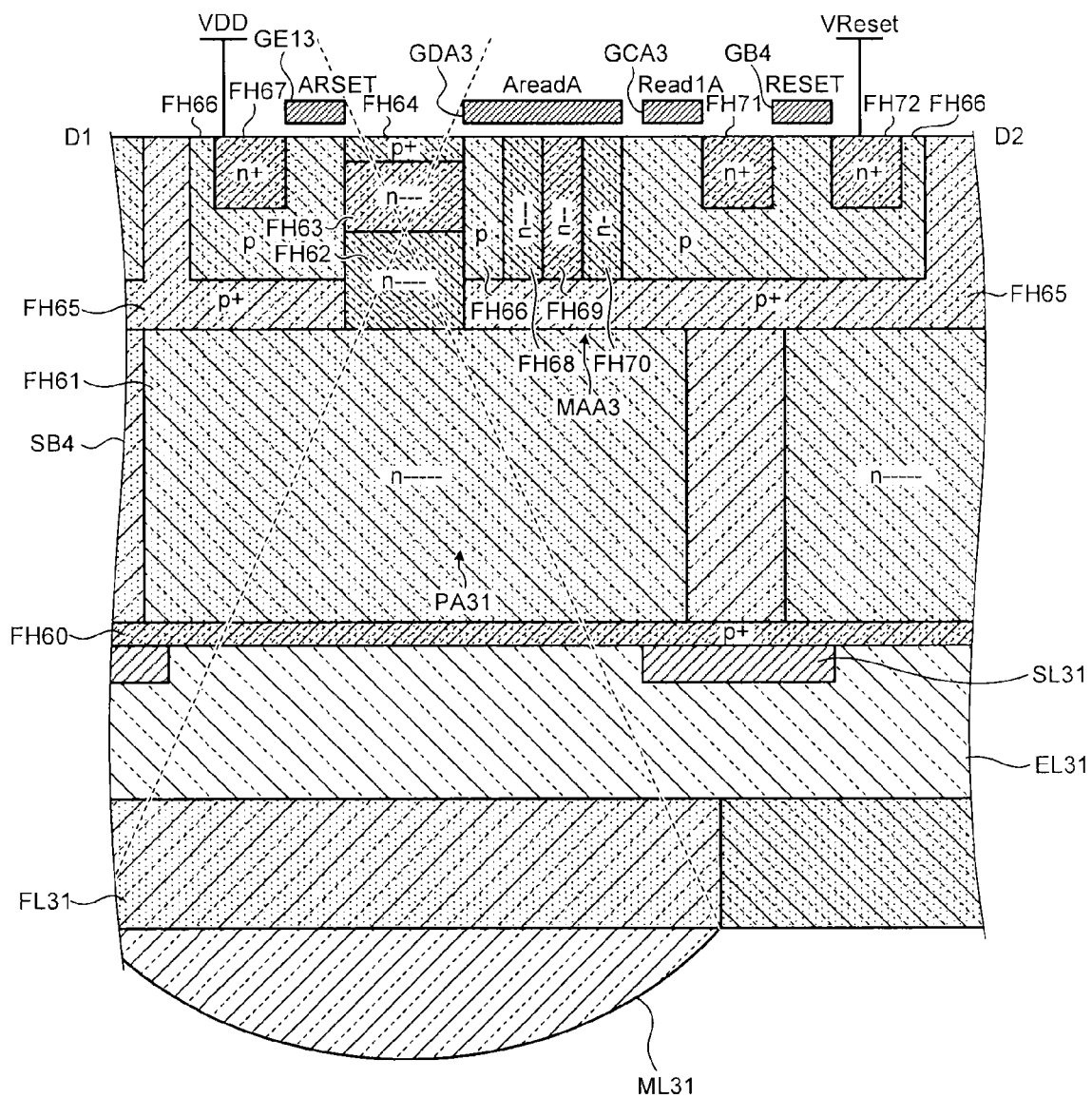
FIG. 22 is a cross-sectional view taken along line D1-D2 of FIG. 21.

FIG. 22 is a cross-sectional view taken along line D1-D2 of FIG. 21.

Referring to FIG. 22, an impurity diffusion layer FH61 is formed at the back surface side of a semiconductor substrate SB4, and an impurity diffusion layer FH60 is formed on the uppermost layer of the back surface side of the semiconductor substrate SB4. A P well FH65 is formed on the front surface side of the semiconductor substrate SB4, and a P well FH66 is formed in the P well FH65. The P well FH65 may be formed to be higher in impurity concentration than the P well FH66. The gate electrodes GB4, GCA3, GDA3, and GE13 are formed above the P well FH66. In the P well FH46, the impurity diffusion layer FH64 is formed between the gate electrodes GE13 and GDA3, the impurity diffusion layer FH66 is formed between the gate electrodes GDA3 and GCA3, and the impurity diffusion layer FH71 is formed between the gate electrodes GCA3 and GB4. Further, in the P well FH46, the impurity diffusion layer FH67 is formed at the side opposite to the impurity diffusion layer FH64 with the gate electrode GE13 interposed therebetween, and the impurity diffusion layer FH72 is formed at the side opposite to the impurity diffusion layer FH71 with the gate electrode GB4 interposed therebetween. The impurity diffusion layers FH63 and FH62 are sequentially formed in the depth direction between the impurity diffusion layers FH64 and FH61. The impurity diffusion layers FH61, FH62, FH63, FH67, FH68, FH69, FH70, FH71, and FH72 may have an n type, and the impurity diffusion layers FH60 and FH64 may have a p type. The impurity diffusion layers FH61, FH62, and FH63 are formed to increase in the impurity concentration in the described order. The impurity diffusion layers FH68, FH69, and FH70 are formed to increase in the impurity concentration in the described order. The photoelectric converting layer PA31 may be arranged to at least partially overlap the charge accumulating layer MAA3. The photoelectric converting layer PA31 may be separated from the charge accumulating layer MAA3 by the P well FH65.

On the back surface side of the semiconductor substrate SB4, the transparent layer EL31 is formed on the impurity diffusion layer FH60, and a microlens ML31 is formed over the transparent layer EL31 with a color filter FL31 interposed therebetween. The light blocking layer SL31 is buried in the transparent layer EL31. The microlens ML31 may make light incident to the back surface side of the semiconductor substrate SB4 to be collected on the photoelectric converting layer PA31 not to be incident to the charge accumulating layer MAA3. The light blocking layer SL31 can block light incident to the back surface side of the semiconductor substrate SB4 from being incident to the charge accumulating layer MAA3. The transparent layer EL31 increases an interval between the photoelectric converting layer PA31 and the microlens ML31, and thus an incident angle of light incident to the photoelectric converting layer PA31 can be reduced.

Here, as the photoelectric converting layer PA31 is arranged to at least partially overlap the charge accumulating layer MAA3, the size of the pixel P can be reduced while supporting the global shutter structure. Further, as the light blocking layer SL31 is formed at the back surface side of the semiconductor substrate SB4, light incident to the back surface side of the semiconductor substrate SB4 can be prevented from being incident to the charge accumulating layer MAA3. Furthermore, as the transparent layer EL31 is formed at the back surface side of the semiconductor substrate SB4, an incident angle of light incident to the photoelectric converting layer PA31 can be reduced, and light to be collected on the photoelectric converting layer PA31 can be prevented from leaking to the charge accumulating layer MAA3. In addition, as the impurity diffusion layer FH60 is formed on the uppermost layer of the back surface side of the semiconductor substrate SB4, a leakage current leaking to the charge accumulating layer MAA3 can be reduced.

Further, as the P well in the front surface side of the semiconductor substrate SB4 has a dual-layer structure, and the P well FH45 separating the photoelectric converting layer PA31 from the charge accumulating layer MAA3 is higher in the impurity concentration than the P well FH46 in which a channel is formed, isolation between the photoelectric converting layer PA31 and the charge accumulating layer MAA3 can be improved. Further, as the P well FH45 is formed, the capacity of the photoelectric converting layer PA31 and the charge accumulating layer MAA3 can be increased, the number of saturated electrons can be increased, and charges generated in the boundary between the photoelectric converting layer PA31 and the charge accumulating layer MAA3 can be easily taken into the photoelectric converting layer PA31.

The potential distribution of the impurity diffusion layers of the photoelectric converting layer and the charge accumulating layer of FIG. 22 is the same as in FIG. 19B. Here, the impurity diffusion layers FH61, FH62, and FH63 are set to increase in the impurity concentration in the described order, and the potential gradient is formed from the back surface side of the semiconductor substrate SB4 toward the front surface side thereof. Thus, charges generated at the back surface side of the photoelectric converting layer PA31 can be collected at the front surface side thereof, and charges can be smoothly transferred from the photoelectric converting layer PA31 to the charge accumulating layer MAA3.

The above embodiments have been described in connection with the example of the two-pixel one-cell structure, but may be applied to another structure such as a one-pixel one-cell structure or a four-pixel one-cell structure. Further, the above embodiments have been described in connection with the method of performing row selection without using an address transistor performing row selection, but an address transistor performing row selection may be disposed in each cell.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device, comprising:
    a photoelectric converting layer that is formed at a back surface side of a semiconductor substrate, and photoelectric-converts and accumulates charges;
    a reading unit that is formed at a front surface side of the semiconductor substrate, and reads out the accumulated charges by photoelectric converting layer;
    a charge accumulating layer that is formed at the front surface side of the semiconductor substrate, and accumulates charges read out by the reading unit; and
    a light collecting unit that makes light incident to the back surface side of the semiconductor substrate to be collected on the photoelectric converting layer not to be incident to the charge accumulating layer, wherein an arrangement is made such that a central position of the charge accumulating layer and a central position of the light collecting unit are deviated.

2. The solid-state imaging device according to claim 1, wherein the charge accumulating layer has a diode structure.

3. The solid-state imaging device according to claim 1, wherein the charge accumulating layer has a CCD structure.

4. The solid-state imaging device according to claim 1, wherein the light collecting unit is a microlens arranged on the photoelectric converting layer.

5. The solid-state imaging device according to claim 1, wherein the photoelectric converting layer is arranged to at least partially overlap the charge accumulating layer.

6. The solid-state imaging device according to claim 1, wherein charge accumulation operations of the photoelectric converting layers of all pixels are simultaneously started, and charges are simultaneously read out from the photoelectric converting layers of all pixels to the charge accumulating layer.

7. The solid-state imaging device according to claim 1, further comprising:
    a global reset transistor that simultaneously resets the photoelectric converting layers of all pixels;
    a global read transistor that simultaneously transfers charges from the photoelectric converting layers of all pixels to the charge accumulating layer;
    a read transistor that reads out the charges transferred to the charge accumulating layer to a floating diffusion of each pixel;
    a detecting transistor that detects the charges read out to the floating diffusion; and
    a reset transistor that resets the floating diffusion.

* * * * *